(12) United States Patent
Ogo et al.

(10) Patent No.: US 12,116,021 B2
(45) Date of Patent: Oct. 15, 2024

(54) TRAVELING VEHICLE SYSTEM

(71) Applicant: MURATA MACHINERY, LTD., Kyoto (JP)

(72) Inventors: Haruki Ogo, Inuyama (JP); Yasuhisa Ito, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 834 days.

(21) Appl. No.: 17/288,938

(22) PCT Filed: Sep. 13, 2019

(86) PCT No.: PCT/JP2019/036184
§ 371 (c)(1),
(2) Date: Apr. 27, 2021

(87) PCT Pub. No.: WO2020/090253
PCT Pub. Date: May 7, 2020

(65) Prior Publication Data
US 2021/0387654 A1 Dec. 16, 2021

(30) Foreign Application Priority Data
Oct. 29, 2018 (JP) .................. 2018-203022

(51) Int. Cl.
*B61B 3/02* (2006.01)
*B61B 13/00* (2006.01)
(Continued)

(52) U.S. Cl.
CPC ................ *B61B 3/02* (2013.01); *B61B 13/00* (2013.01); *B61B 13/06* (2013.01); *B65G 1/0457* (2013.01);
(Continued)

(58) Field of Classification Search
CPC ......... B61B 13/06; B61B 13/00; B61B 13/04; B61B 3/02; H01L 21/67706;
(Continued)

(56) References Cited

U.S. PATENT DOCUMENTS

2010/0294848 A1* 11/2010 Bullis ................. B60B 17/0072
188/41
2015/0332948 A1* 11/2015 Ikeda ................ H01L 21/67736
700/230
(Continued)

FOREIGN PATENT DOCUMENTS

JP  2012-116648 A  6/2012
JP  6168476 B2  7/2017
(Continued)

OTHER PUBLICATIONS

Official Communication issued in International Patent Application No. PCT/JP2019/036184, mailed on Dec. 3, 2019.

*Primary Examiner* — Zachary L Kuhfuss
*Assistant Examiner* — James William Jones
(74) *Attorney, Agent, or Firm* — Keating & Bennett, LLP

(57) ABSTRACT

A traveling vehicle system includes a track including a first gap, a partial track, and a second gap, a traveling vehicle including a drive wheel and first and second auxiliary wheels, a first auxiliary track on a near side of the first gap in a traveling direction and in contact with a lower end of the first auxiliary wheel while a lower end of the drive wheel passes through the first gap when the drive wheel enters the partial track, and a second auxiliary track on a far side of the second gap in the traveling direction and in contact with a lower end of the second auxiliary wheel while the lower end of the drive wheel passes through the second gap when the drive wheel leaves the partial track.

9 Claims, 13 Drawing Sheets

(51) Int. Cl.
*B61B 13/06* (2006.01)
*B65G 1/04* (2006.01)
*B66C 7/02* (2006.01)
*B66C 7/08* (2006.01)
*B66C 7/12* (2006.01)
*B66C 9/02* (2006.01)
*B66C 9/04* (2006.01)
*B66C 9/16* (2006.01)
*H01L 21/677* (2006.01)
*B61B 13/04* (2006.01)

(52) U.S. Cl.
CPC .............. *B65G 1/0478* (2013.01); *B66C 7/02* (2013.01); *B66C 7/08* (2013.01); *B66C 7/12* (2013.01); *B66C 9/02* (2013.01); *B66C 9/04* (2013.01); *B66C 9/16* (2013.01); *H01L 21/67706* (2013.01); *H01L 21/67715* (2013.01); *H01L 21/67733* (2013.01); *B61B 13/04* (2013.01); *B65G 2201/0297* (2013.01); *H01L 21/6773* (2013.01)

(58) Field of Classification Search
CPC ........... H01L 21/67715; H01L 21/6773; H01L 21/67733; B65G 1/0457; B65G 1/0478; B65G 2201/0297; B66C 7/02; B66C 7/12; B66C 7/08; B66C 9/02; B66C 9/04; B66C 9/16
USPC ........................................................ 104/121
See application file for complete search history.

(56) References Cited

U.S. PATENT DOCUMENTS

| | | | |
|---|---|---|---|
| 2016/0272468 A1* | 9/2016 | Izumi | ........................ B66C 7/02 |
| 2016/0288802 A1* | 10/2016 | Kinugawa | ................. B61B 3/02 |
| 2019/0189488 A1 | 6/2019 | Ito | |

FOREIGN PATENT DOCUMENTS

| | | | |
|---|---|---|---|
| KR | 20130117143 A | * 10/2013 | |
| WO | WO-2006028384 A2 | * 3/2006 | ............. B61B 13/04 |
| WO | WO-2013179386 A1 | * 12/2013 | ............... B66C 5/02 |
| WO | WO-2018037762 A1 | * 3/2018 | ............... B61B 3/02 |

* cited by examiner

TRAVELING VEHICLE SYSTEM

BACKGROUND OF THE INVENTION

1. Field of the Invention

The present invention relates to a traveling vehicle system.

2. Description of the Related Art

In manufacturing factories, such as semiconductor manufacturing factories, a traveling vehicle system conveying articles, such as conveyance containers, (front opening unified pods (FOUPs) or reticle pods) housing semiconductor wafers or reticles by using traveling vehicles is used, for example. As this type of traveling vehicle system, a system in which traveling vehicles holding articles travel along a track on the ceiling is known. To increase the variety of traveling routes of the traveling vehicles, a grid-shaped track that causes the traveling vehicles to travel longitudinally and latitudinally has been developed.

In the traveling vehicle system causing the traveling vehicles to travel longitudinally and latitudinally, in a configuration in which a container housing an article is placed above the track together with a main body of a traveling vehicle, when the article is loaded and unloaded to and from a certain position below the track, the article is required to be hoisted and lowered using a portion in which the track is absent or a gap between one portion and another portion of the track, and thus limiting article loading/unloading positions. Given these circumstances, a traveling vehicle system enabling the traveling vehicle to travel longitudinally and latitudinally along a grid-shaped track with an article held below the track has been developed (refer to International Publication No. 2018/037762).

In the system holding an article below the track like the traveling vehicle system in International Publication No. 2018/037762, traveling wheels are provided above the track, whereas the container for the article or the main body of the traveling vehicle is provided below the track. Consequently, the configuration including a coupler coupling the traveling wheels and the container (or the main body) to each other is provided across above and below the track. When this configuration is used in a grid-shaped track, a gap (a slit) to allow the coupler to pass therethrough is required at a crossing position of the track. The traveling vehicle system in International Publication No. 2018/037762 includes a partial track provided with a gap at the crossing position of the track and dividing the track at the crossing position by the gap. With the gap in a portion of the track, there is a possibility that the traveling wheels of the traveling vehicle fall in the gap causing vibration of the article, and thus this vibration is required to be prevented. In the traveling vehicle system in International Publication No. 2018/037762, a first auxiliary wheel and a second auxiliary wheel are provided on the front and the rear in a traveling direction of one traveling wheel to prevent the traveling wheel from falling into the gap provided in a portion of the grid-shaped track.

A traveling vehicle system locating auxiliary wheels such that lower ends of the auxiliary wheels are higher than lower ends of traveling wheels and providing an auxiliary track with which the auxiliary wheels are in contact when the traveling wheels are positioned on a gap during traveling in a track to prevent the traveling wheels from falling into the gap has been developed (refer to Japanese Unexamined Patent Application Publication No. 2012-116648).

In the traveling vehicle system in International Publication No. 2018/037762, to prevent the first auxiliary wheel and the second auxiliary wheel from coming into contact with the track when the traveling wheel is in contact with a traveling surface, lower ends of the first auxiliary wheel and the second auxiliary wheel are higher than lower ends of the traveling wheels. In this configuration, falling of the traveling wheels in the gap can occur by the amount corresponding to a difference between the lower ends of the first auxiliary wheel and the second auxiliary wheel and the lower ends of the traveling wheels.

In the partial track described above, a traveling surface on which the traveling wheels travel may partially overlap across a plurality of directions. Thus, in a configuration in which the auxiliary track described in Japanese Unexamined Patent Application Publication No. 2012-116648 is provided in the partial track, the traveling of the traveling wheels is hindered.

SUMMARY OF THE INVENTION

Preferred embodiments of the present invention eliminate placement of an auxiliary track or the like with which a lower end of an auxiliary wheel is in contact in a partial track, while preventing a traveling wheel from falling into a gap provided in a portion of a track.

A traveling vehicle system according to a preferred embodiment of the present invention includes a track and a traveling vehicle to travel along the track, the track including a first gap, a partial track, and a second gap in order along a traveling direction of the traveling vehicle, the traveling vehicle including a drive wheel to roll on a traveling surface of the track, a first auxiliary wheel not in contact with the traveling surface, on a rear side in the traveling direction of the drive wheel, and fixed in an up-and-down direction with respect to the drive wheel, and a second auxiliary wheel not in contact with the traveling surface, on a front side in the traveling direction of the drive wheel, and fixed in the up-and-down direction with respect to the drive wheel, a spacing between a rotation axis of the drive wheel and a rotation axis of the first auxiliary wheel in the traveling direction being a length of the first gap in the traveling direction or more, and a spacing between the rotation axis of the drive wheel and a rotation axis of the second auxiliary wheel in the traveling direction being a length of the second gap in the traveling direction or more, the traveling vehicle system including a first auxiliary track on a near side of the first gap in the traveling direction, with a length in the traveling direction at least equal or substantially equal to the length of the first gap in the traveling direction, and with which a lower end of the first auxiliary wheel is in contact while a lower end of the drive wheel passes through the first gap when the drive wheel enters the partial track, and a second auxiliary track on a far side of the second gap in the traveling direction, with a length in the traveling direction at least equal or substantially equal to the length of the second gap in the traveling direction, and with which a lower end of the second auxiliary wheel is in contact while the lower end of the drive wheel passes through the second gap when the drive wheel leaves the partial track, the second auxiliary track being absent at a position with which the second auxiliary wheel is in contact while the first auxiliary wheel is in contact with the first auxiliary track, and the first auxiliary track being absent at a position with which the first auxiliary wheel is in contact while the second auxiliary wheel is in contact with the second auxiliary track.

The first auxiliary wheel and the second auxiliary wheel may be deviated in a rotation axis direction with respect to the drive wheel and lower ends are at a first height higher than the lower end of the drive wheel, and the first auxiliary track and the second auxiliary track may include upper surfaces provided at positions deviated from the traveling surface of the track and at a second height higher than the traveling surface. The first height and the second height may be the same or substantially the same. Either or both of the first auxiliary track and the second auxiliary track may include a protrusion provided on the track. The first auxiliary wheel and the second auxiliary wheel may be deviated from each other in a rotation axis direction, and the first auxiliary track and the second auxiliary track may be deviated in the rotation axis direction in accordance with the first auxiliary wheel and the second auxiliary wheel, respectively.

The first auxiliary track may be positioned such that contact of the first auxiliary wheel starts when the lower end of the drive wheel reaches the first gap, and the second auxiliary track may be positioned such that contact of the second auxiliary wheel starts when the lower end of the drive wheel reaches the second gap. The traveling vehicle may include the drive wheel on each of a front side and a rear side in the traveling direction, and a spacing in the traveling direction between a lower end of the drive wheel on the front side and a lower end of the drive wheel on the rear side in the traveling direction may be set except for a range from a length of the partial track in the traveling direction to a length between an end of the first gap on the near side and an end of the second gap on the far side in the traveling direction. The traveling vehicle may include a main body mounted on a coupler vertically hanging from the rotation axis of the drive wheel to be positioned below the track, and both the first gap and the second gap may enable the coupler to pass therethrough. The track may include a first track along a first direction and a second track along a second direction orthogonal or substantially orthogonal to the first direction, and the partial track may be positioned at a crossing portion of the first track and the second track.

In traveling vehicle systems according to preferred embodiments of the present invention, while the lower end of the drive wheel passes through the first gap, the first auxiliary wheel is in contact with the first auxiliary track, and the second auxiliary wheel is not in contact with the traveling surface of the track and the second auxiliary track, and while the lower end of the drive wheel passes through the second gap, the second auxiliary wheel is in contact with the second auxiliary track, and the first auxiliary wheel is not in contact with the traveling surface of the track and the second auxiliary track, and thus, placement of an auxiliary track or the like with which the lower end of the first auxiliary wheel or the second auxiliary wheel is in contact can be eliminated in the partial track while preventing the drive wheel from falling into the first gap or the second gap by either of the first auxiliary wheel or the second auxiliary wheel. Consequently, even when the traveling surface of the drive wheel in the partial track partially overlaps in a plurality of directions, for example, the auxiliary track or the like is not positioned on the traveling surface, and thus the drive wheel can smoothly travel in the partial track.

In the configuration in which the first auxiliary wheel and the second auxiliary wheel are deviated in a rotation axis direction with respect to the drive wheel and provided such that lower ends are at a first height higher than the lower end of the drive wheel, and the first auxiliary track and the second auxiliary track include upper surfaces at positions deviated from the traveling surface of the track and including a second height higher than the traveling surface, the first auxiliary wheel and the second auxiliary wheel are deviated in the rotation axis direction with respect to the drive wheel, and in addition, the first auxiliary track and the second auxiliary track are deviated from the traveling surface of the track, and thus, the first auxiliary track and the second auxiliary track can be easily positioned while preventing the drive wheel from overriding the first auxiliary track and the second auxiliary track.

In the configuration in which the first height and the second height are the same or substantially the same height, when the lower end of the drive wheel passes through the first gap or the second gap, the drive wheel can be prevented from moving up and down from the height of the traveling surface to maintain the height of the drive wheel, such that the drive wheel is prevented from shaking up and down to vibrate during traveling.

In the configuration in which either or both of the first auxiliary track and the second auxiliary track include a protrusion on the track, the first auxiliary track and the second auxiliary track can be easily and economically provided.

In the configuration in which the first auxiliary wheel and the second auxiliary wheel are deviated from each other in a rotation axis direction, and the first auxiliary track and the second auxiliary track are deviated in the rotation axis direction in accordance with the first auxiliary wheel and the second auxiliary wheel, respectively, the first auxiliary wheel and the second auxiliary wheel are deviated in the rotation axis direction, and the first auxiliary track and the second auxiliary track are deviated in the rotation axis direction, and thus, the first auxiliary wheel is prevented from being in contact with the second auxiliary track, the first auxiliary wheel is prevented from being in contact with the second auxiliary track, and resistance or vibration during traveling is prevented.

In the configuration in which the first auxiliary track is positioned such that contact of the first auxiliary wheel starts when the lower end of the drive wheel reaches the first gap, and the second auxiliary track is positioned such that contact of the second auxiliary wheel starts when the lower end of the drive wheel reaches the second gap, contact of the first auxiliary wheel starts when the lower end of the drive wheel reaches the first gap, or contact of the second auxiliary wheel starts when the lower end of the drive wheel reaches the second gap, and thus, at the same time or substantially the same time as the reaching of the lower end of drive wheel to the first gap or the second gap, the first auxiliary wheel or the second auxiliary wheel can support the traveling vehicle, and in addition, the first auxiliary track and the second auxiliary track are short in the traveling direction.

In the configuration in which the traveling vehicle includes the drive wheel on each of a front side and a rear side in the traveling direction, and a spacing in the traveling direction between a lower end of the drive wheel on the front side and a lower end of the drive wheel on the rear side in the traveling direction is set, except for a range from a length of the partial track in the traveling direction to a length between an end of the first gap on the near side and an end of the second gap on the far side in the traveling direction, the spacing between the drive wheels on the front side and the rear side is set, except for the range from the length of the partial track to the length between the end of the first gap on the near side and the end of the second gap on the far side, and thus, even when the lower end of one drive wheel of the front side and the rear side is passing through the first gap or the second gap, the other drive wheel is in contact with the traveling surface of the track, and thus, the traveling driving force of the traveling vehicle is prevented from being interrupted.

In the configuration in which the traveling vehicle includes a main body mounted on a coupler vertically hanging from the rotation axis of the drive wheel to be positioned below the track, and both the first gap and the second gap enable the coupler to pass therethrough, the traveling vehicle includes the main body via the coupler, and the coupler is able to pass through the first gap and the second gap, and thus, using the first gap and the second gap, a crossing portion or a portion changing the traveling direction at a right angle or the like is able to be provided in a portion of the track.

In the configuration in which the track includes a first track along a first direction and a second track along a second direction orthogonal or substantially orthogonal to the first direction, and the partial track is positioned at a crossing portion of the first track and the second track, since the partial track is positioned at the crossing portion of the first track and the second track, even when the traveling vehicle travels along either of the first track or the second track, the drive wheel is prevented from coming into contact with the first auxiliary track or the second auxiliary track when passing through the crossing portion, and unnecessary vibration is prevented from occurring when the traveling vehicle passes through the crossing portion.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6A is a side view, FIG. 6B is an elevation view, and FIG. 6C is a top view.

DETAILED DESCRIPTION OF THE PREFERRED EMBODIMENTS

Figure 1:
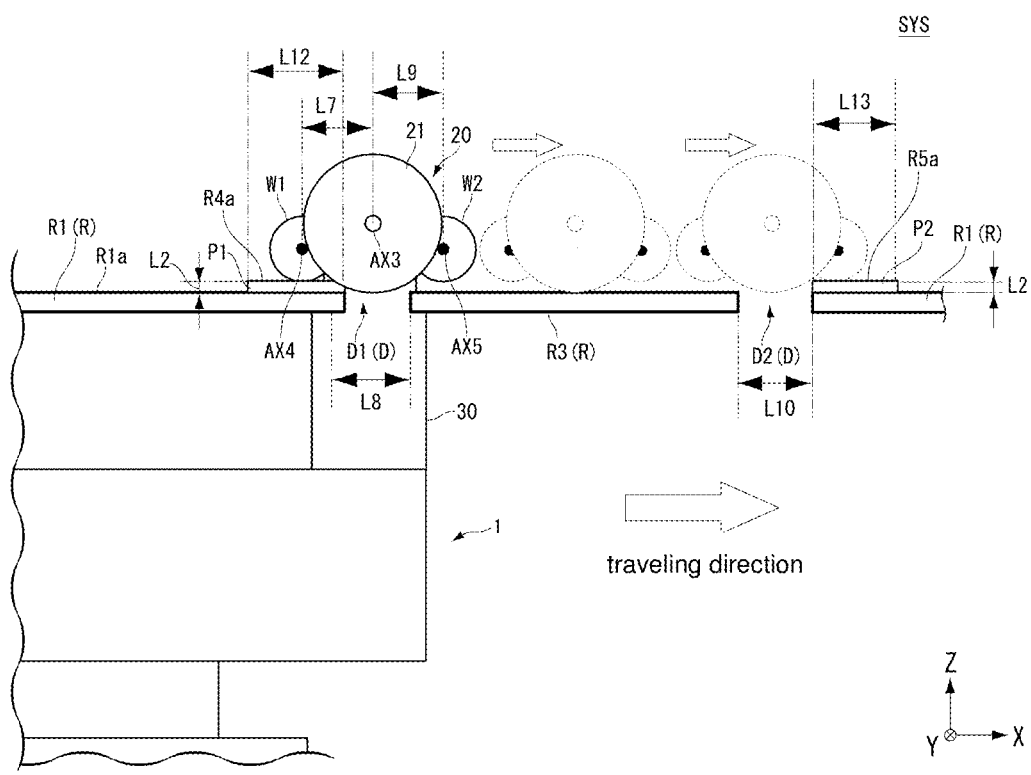
FIG. 1 is a diagram schematically illustrating an example of a traveling vehicle system according to a preferred embodiment of the present invention.

The following describes preferred embodiments of the present invention with reference to the accompanying drawings. However, the present invention is not limited to the following description. To describe the preferred embodiments, the drawings are represented with a scale changed as appropriate, such as in a partially enlarged or emphasized manner. In the drawings, directions in the drawings are described using an XYZ coordinate system. In this XYZ coordinate system, a plane parallel or substantially parallel to a horizontal plane is defined as an XY plane. On this XY plane, a linear direction, which is a traveling direction of a traveling vehicle 1, is denoted by an X direction for the sake of convenience, and a direction orthogonal or substantially orthogonal to the X direction is denoted by a Y direction. A direction perpendicular or substantially perpendicular to the XY plane is denoted by a Z direction. Each of the X direction, the Y direction, and the Z direction is described with the arrow direction in the drawings as a + direction and the direction opposite to the arrow direction as a − direction. A rotational direction with the Y direction as an axis is denoted by a θY direction. A rotational direction with the Z direction as an axis is denoted by a θZ direction. The traveling vehicle 1 may travel in the Y direction apart from traveling in the X direction. The traveling vehicle 1 can travel in other than the linear direction and may travel along a track with a curvilinear shape in a plan view, for example.

Figure 2:
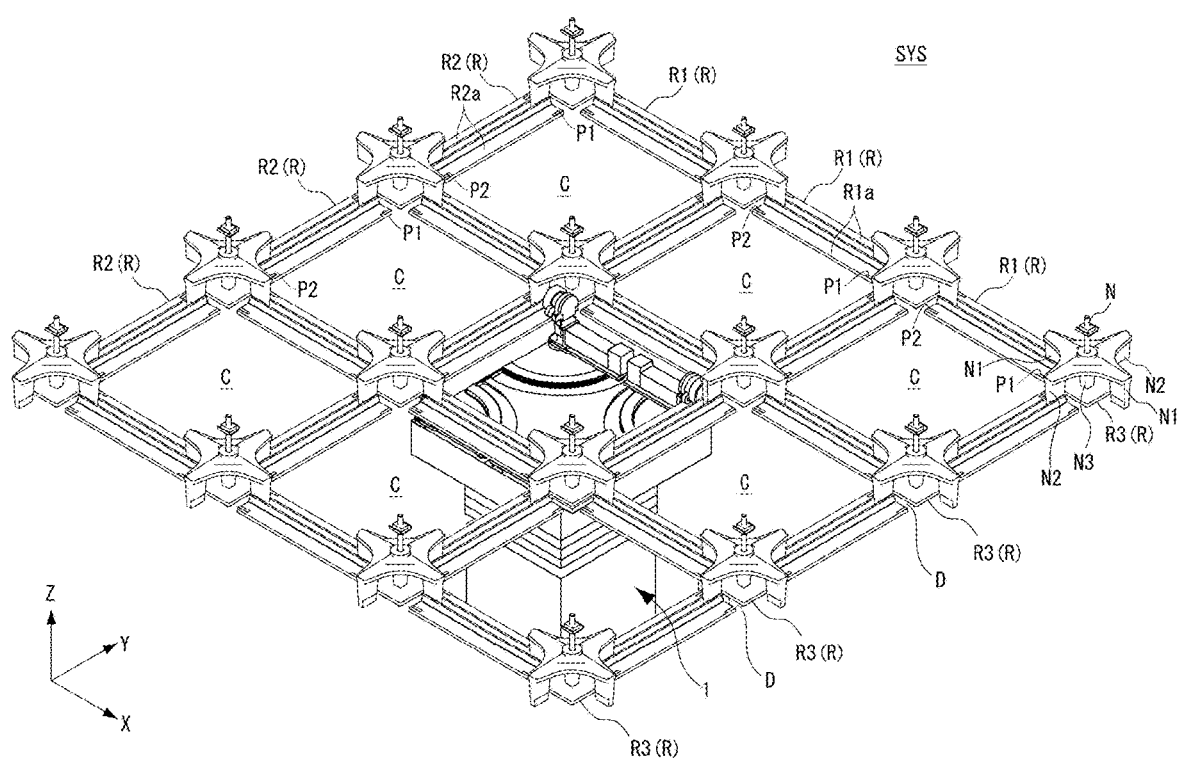
FIG. 2 is a perspective view illustrating an example of the traveling vehicle system according to a preferred embodiment of the present invention.
Figure 3:
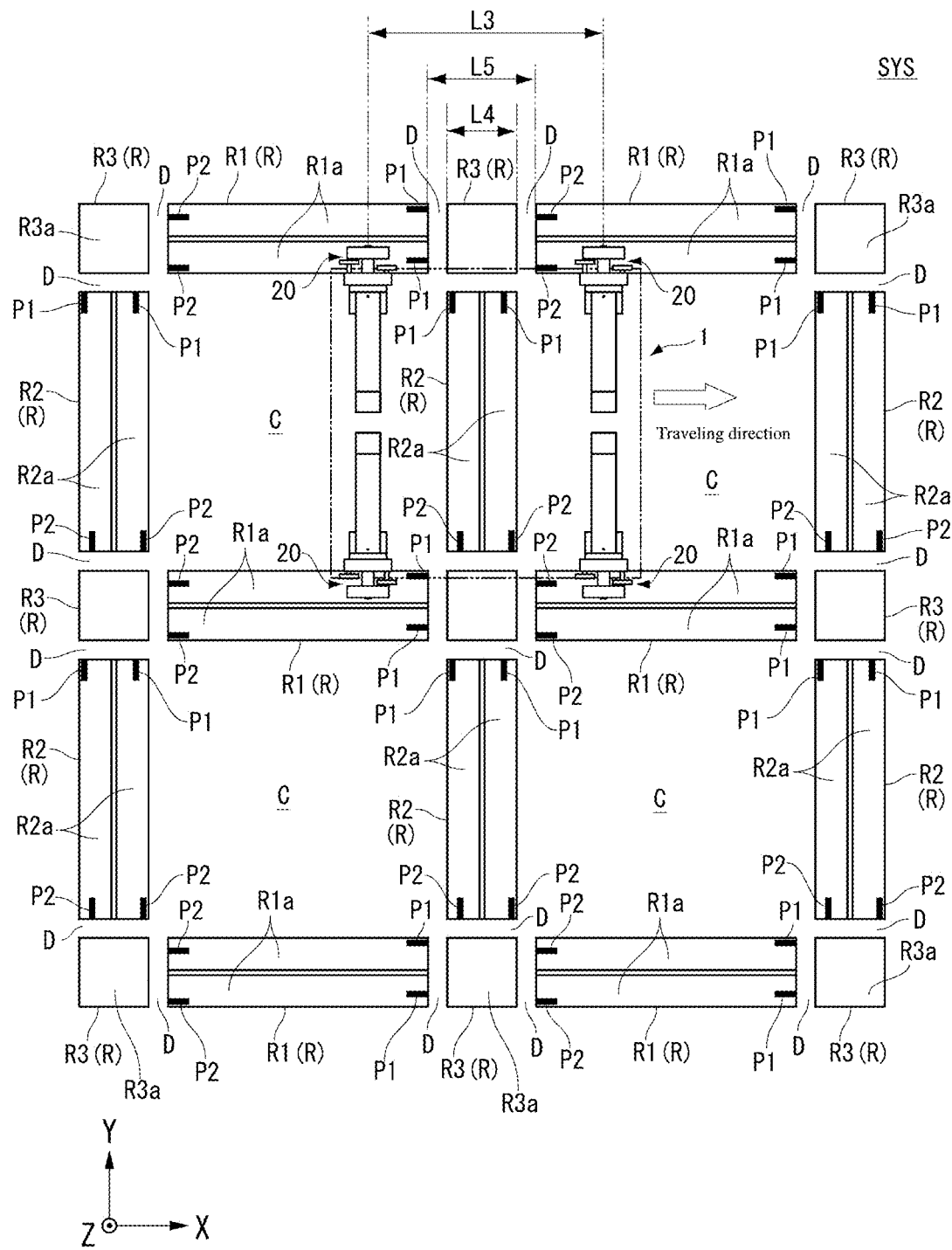
FIG. 3 is a top view illustrating an example of a track.

FIG. 1 is a diagram schematically illustrating an example of a traveling vehicle system SYS according to a preferred embodiment of the present preferred embodiment. FIG. 2 is a perspective view illustrating an example of the traveling vehicle system SYS according to the present preferred embodiment. FIG. 3 is a top view illustrating an example of a track R viewed from the +Z direction. FIG. 3 illustrates a portion of the track R.

As illustrated in FIG. 1 and FIG. 2, the traveling vehicle system SYS includes the track R and the traveling vehicle 1 traveling along the track R. The traveling vehicle system SYS conveys an article M by the traveling vehicle 1 in a clean room of a semiconductor manufacturing factory, for example. The traveling vehicle 1 conveys the article M (refer to FIG. 5), such, for example, as a front opening unified pod (FOUP) housing semiconductor wafers or a reticle pod housing reticles. In the traveling vehicle system SYS, the traveling vehicle 1 moves along the grid-shaped track R to convey the article M. In the traveling vehicle system SYS, a plurality of traveling vehicles 1 may be used. The traveling vehicles 1 convey the article M, to enable high-density conveyance, and the conveyance efficiency of the article M can be improved. The traveling vehicle system SYS can be used for equipment of other than the field of semiconductor device manufacturing.

As illustrated in FIG. 2 and FIG. 3, the track R is a grid-shaped track installed so as to have a grid shape in a plan view. The grid-shaped track is one aspect of the track R. The track R is disposed on the ceiling (not illustrated) of a building, such as a clean room, for example, or near the ceiling.

The track R includes a first track R1, a second track R2, and a partial track R3. The first track R1 extends along the X direction (a first direction). The second track R2 extends along the Y direction (a second direction). In the present preferred embodiment, a plurality of first tracks R1 and a plurality of second tracks R2 extend along directions orthogonal or substantially orthogonal to each other but do not directly cross each other. The partial track R3 is located at a crossing portion at which the first track R1 and the second track R2 cross each other.

The first tracks R1 and the second tracks R2 extend along the directions orthogonal or substantially orthogonal to each other, such that the track R includes grid-shaped cells C (sections) that are adjacent to each other in a plan view. The traveling vehicle 1 has dimensions housed in one cell C in a plan view (refer to FIG. 2). With this configuration, one traveling vehicle 1 can pass another traveling vehicle 1 traveling along an adjacent track R, and thus when the traveling vehicles 1 are located in the track R, a range in which each traveling vehicle 1 can travel without interfering with another traveling vehicle 1 can be increased.

The first track R1, the second track R2, and the partial track R3 are hung from the ceiling via a hanger N. (refer to FIG. 2). The hanger N includes a first portion N1 to hang the first track R1, a second portion N2 to hang the second track R2, and a third portion N3 to hang the partial track R3. First portions N1 and second portions N2 are each provided at two locations across the third portion N3. The first track R1, the second track R2, and the partial track R3 are provided along the same or substantially the same horizontal plane (the XY plane).

The track R includes a first gap D1, the partial track R3, and a second gap D2 in order along the traveling direction of the traveling vehicle 1 (refer to FIG. 1). The first gap D1 is provided on an opposite side (may also be referred to as a near side or a rear side) to the traveling direction of the traveling vehicle 1 with respect to the partial track R3. The second gap D2 is provided on a traveling direction side (may also be referred to as a far side or a front side) of the traveling vehicle 1 with respect to the partial track R3. The first gap D1 and the second gap D2 are the same or substantially the same. When the first gap D1 and the second gap D2 are not discriminated from each other, they are represented as a gap D, as appropriate.

The first gap D1 and the second gap D2 are provided between the first track R1 and the partial track R3 or between the second track R2 and the partial track R3 (refer to FIG. 2). The first gap D1 and the second gap D2 are portions through which a coupler 30 described below as a portion of the traveling vehicle 1 passes when the traveling vehicle 1 travels along the first track R1 to cross the second track R2 or when the traveling vehicle 1 travels along the second track R2 to cross the first track R1. Consequently, both of the first gap D1 and the second gap D2 have size (spacing) that enables the coupler 30 to pass therethrough. In the case of the configuration in which the coupler 30 can pass through both of the first gap D1 and the second gap D2, as will be described below in FIG. 13A to 13C, the first gap D1 and the second gap D2 are used, such that a connector 32 of the coupler 30 can be turned, and thus a portion in which the traveling direction of the traveling vehicle 1 can be changed can be provided in the grid-shaped track. The first gap D1 and the second gap D2 will further be described below.

The first track R1, the second track R2, and the partial track R3 include traveling surfaces (upper surfaces) R1a, R2a, and R3a, respectively, on which a drive wheel 21 described below travels (refer to FIG. 2 and FIG. 3). The first track R1 and the second track R2 include two traveling surfaces R1a and R2a, respectively, adjacent to each other. The traveling surfaces R1a, R2a, and R3a are provided along the same or substantially the same horizontal plane (the XY plane).

The first track R1 and the second track R2 include first auxiliary tracks P1 with which a first auxiliary wheel W1 described below is in contact and second auxiliary tracks P2 with which a second auxiliary wheel W2 is in contact, respectively (refer to FIG. 3). A first auxiliary track P1 and a second auxiliary track P2 are provided as a pair. The first track R1 includes a pair of the first auxiliary track P1 and the second auxiliary track P2 on each of the +Y side and the −Y side of the first track R1. The second track R2 includes a pair of the first auxiliary track P1 and the second auxiliary track P2 on each of the +X side and the −X side of the second track R2. As illustrated in FIG. 3, on each of the +Y side and the −Y side of the first track R1, the first auxiliary track P1 is at an end of the first track R1 on the +X side, the second auxiliary track P2 is at an end of the first track R1 on the −X side, and each first auxiliary track P1 is on the +Y side of the second auxiliary track P2 as a pair, for example. On each of the +X side and the −X side of the second track R2, the first auxiliary track P1 is at an end of the second track R2 on the +Y side, the second auxiliary track P2 is at an end of the second track R2 on the −Y side, and each first auxiliary track P1 is on the −X side of the second auxiliary track P2 as a pair. The first auxiliary track P1 and the second auxiliary track P2 include traveling surfaces (upper surfaces) R4a and R5a (refer to FIG. 1) with which the first auxiliary wheel W1 and the second auxiliary wheel W2 are in contact, respectively. The traveling surface R4a of the first auxiliary track P1 and the traveling surface R4a of the first auxiliary track P1 are at a second height L2 higher than the traveling surfaces R1a and R2a of the drive wheel 21. The second height L2 is set to be a few hundred micrometers to a few millimeters, for example. The traveling surface R4a of the first auxiliary track P1 and the traveling surface R4a of the first auxiliary track P1 may be at different heights from each other with respect to the traveling surfaces R1a and R2a of the drive wheel 21. The configuration of the first auxiliary track P1 and the second auxiliary track P2 illustrated in FIG. 3 is an example and may be another configuration. In the first track R1, the first auxiliary track P1 may be provided on the −Y side of the second auxiliary track P2 as a pair, and in the second track R2, the first auxiliary track P1 may be provided on the +X side of the second auxiliary track P2 as a pair, for example.

The first auxiliary track P1 and the second auxiliary track P2 each include a protrusion provided on the track R (refer to FIG. 1). The first auxiliary track P1 and the second auxiliary track P2 each include a protrusion protruding in the +Z direction with respect to an upper surface (a surface on the +Z side) of the track R. The shapes of the first auxiliary track P1 and the second auxiliary track P2 are each, for example, rectangular or substantially rectangular in a plan view. The first auxiliary track P1 and the second auxiliary track P2 may include mounting members on the track R or may be integral with the track R. In the case of the configuration in which the first auxiliary track P1 and the second auxiliary track P2 include the protrusions by configuring a portion of the track R to protrude, there is no need to provide the first auxiliary track P1 and the second auxiliary track P2 apart from the track R, and thus the configuration of the apparatus can be simplified. When either or both of the first auxiliary track P1 and the second auxiliary track P2 include the protrusions provided on the track R, the first auxiliary track P1 and the second auxiliary track P2 can be provided easily and at a low cost. The shapes of the first auxiliary track P1 and the second auxiliary track P2 are each any suitable shape. The shapes of the first auxiliary track P1 and the second auxiliary track P2 may be a shape in which an end on a side that the first auxiliary wheel W1 and the second auxiliary wheel W2 enter includes a slope or a shape including a guide limiting movement of the first auxiliary wheel W1 and the second auxiliary wheel W2 in a direction orthogonal or substantially orthogonal to their traveling direction, for example.

The configuration in which the partial track R3 is disposed at the crossing portion of the first track R1 and the second track R2 includes a case in which the traveling vehicle 1 enters and passes through the partial track R3 in the X direction from the first track R1, and a case in which the traveling vehicle 1 enters and passes through the partial track R3 in the Y direction from the second track R2, and thus in the partial track R3, the traveling surface R3a on which the drive wheel 21 of the traveling vehicle 1 travels partially overlaps in a plurality of directions, or the X direction and the Y direction. Thus, the configuration in which the first auxiliary track P1 and the second auxiliary track P2 are provided in the partial track R3 hinders the traveling of the traveling vehicle 1. Thus, in the present preferred embodiment, neither the first auxiliary track P1 nor the second auxiliary track P2 is provided on the partial track R3. In the case of the configuration in which neither the first auxiliary track P1 nor the second auxiliary track P2 is provided on the partial track R3, even when the traveling surface R3a of the drive wheel 21 in the partial track R3 partially overlaps in a plurality of directions, the first auxiliary track P1 or the second auxiliary track P2 is not located on the traveling surface R3a, and thus the drive wheel 21 can smoothly travel in the partial track R3.

As described above, in the present preferred embodiment, the track R includes the first track R1 extending along the first direction and the second track R2 extending along the second direction orthogonal or substantially orthogonal to the first direction, and the partial track R3 is located at the crossing portion of the first track R1 and the second track R2. With this configuration, since the partial track R3 provided with neither the first auxiliary track P1 nor the second auxiliary track P2 is located at the crossing portion of the first track R1 and the second track R2, even when the traveling vehicle 1 travels along either of the first track R1 or the second track R2, the drive wheel 21 is prevented from coming into contact with the first auxiliary track P1 or the second auxiliary track P2 when passing through the crossing portion, and unnecessary vibration can be prevented from occurring when the traveling vehicle 1 passes through the crossing portion.

Figure 4:
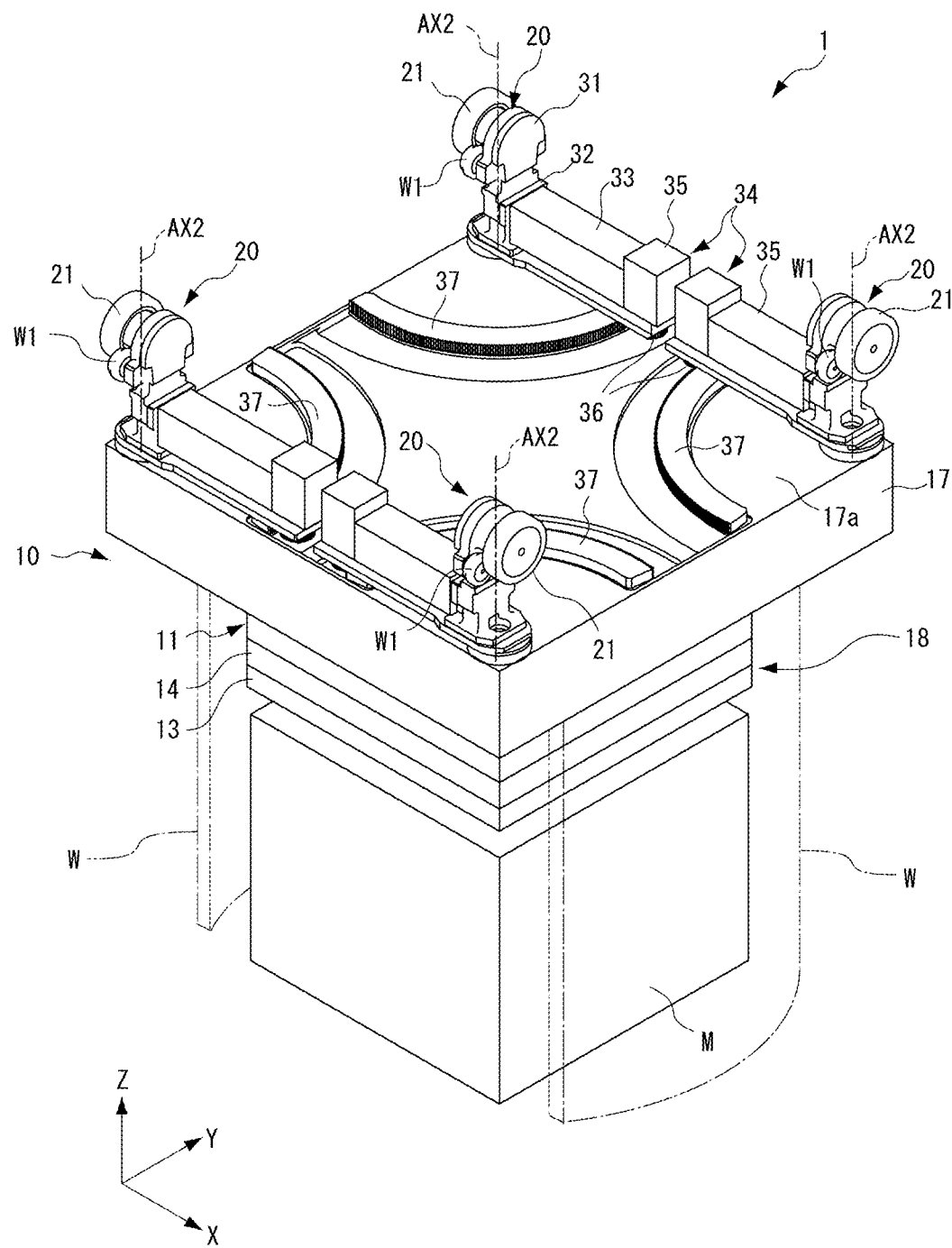
FIG. 4 is a perspective view illustrating an example of a traveling vehicle.
Figure 5:
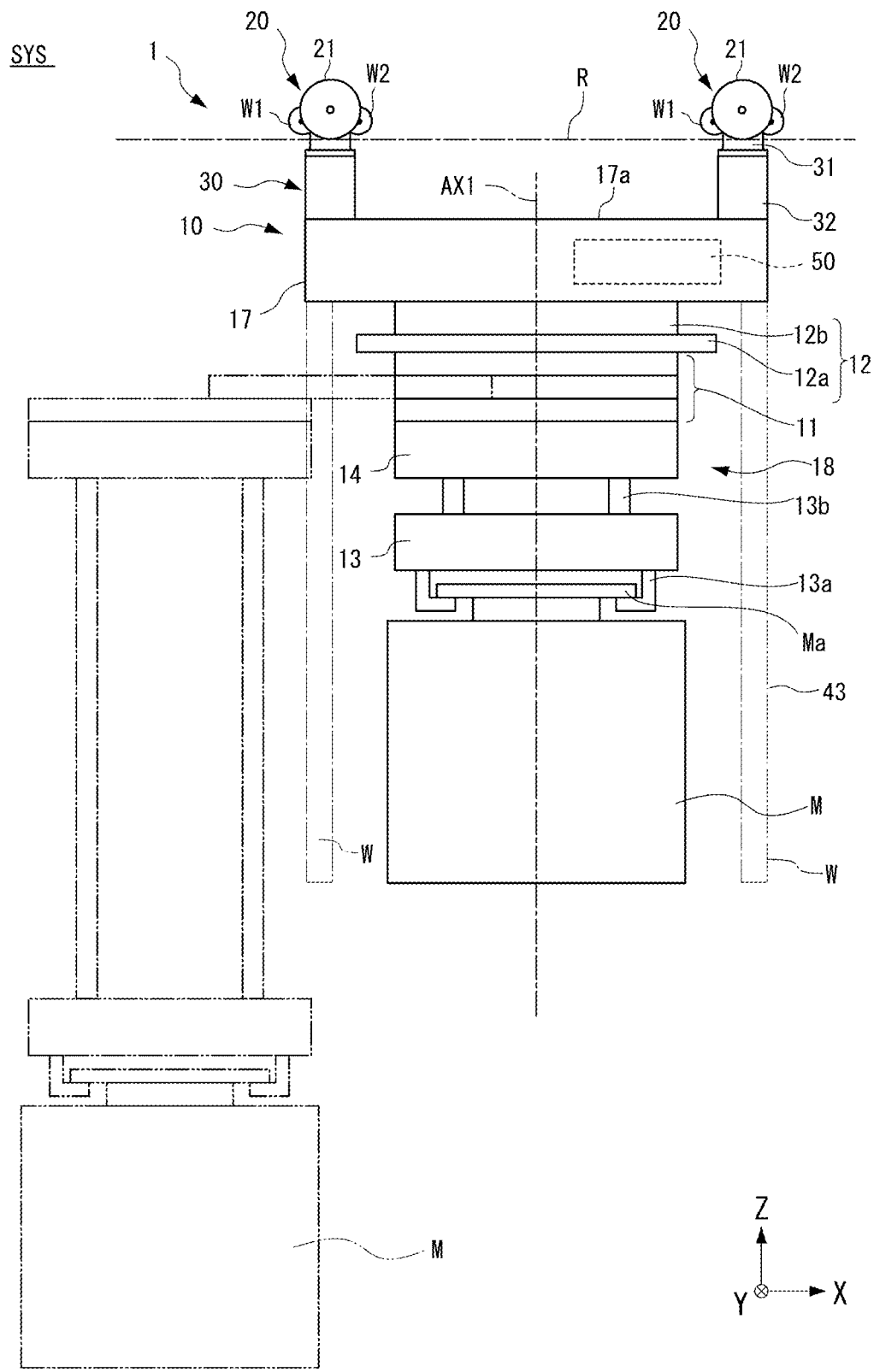
FIG. 5 is a side view of the traveling vehicle illustrated in FIG. 4.

The traveling vehicle 1 will be described below. FIG. 4 is a perspective view illustrating an example of the traveling vehicle 1. FIG. 5 is a side view viewing the traveling vehicle illustrated in FIG. 4 from the −Y direction. The traveling vehicle 1 includes a main body 10, travelers 20, couplers 30 (couplers), and a controller 50 (refer to FIG. 5). The controller 50 collectively controls operations of the respective portions and elements of the traveling vehicle 1. The controller 50 may be provided in the main body 10 or provided outside the main body 10. The main body 10 is disposed below (on the −Z side of) the track R. The main body 10 is mounted on the couplers 30 vertically hanging from a rotation axis AX3 of the drive wheel 21 to be located below the track R. The main body 10 has a rectangular or substantially rectangular shape, for example, in a plan view. The main body 10 has dimensions housed in one cell C in the grid-shaped track R in a plan view (refer to FIG. 2). With this configuration, a space in which one traveling vehicle 1 passes another traveling vehicle 1 traveling along an adjacent first track R1 or second track R2 is ensured. The main body 10 includes an upper portion 17 and a transfer apparatus 18. The upper portion 17 hangs on the travelers 20 via the couplers 30. The upper portion 17 is rectangular or substantially rectangular in a plan view, for example, and includes four corner portions in an upper surface 17a (refer to FIG. 4).

The transfer apparatus 18 is provided below the upper unit 17. The transfer apparatus 18 holds the article M and performs reception and delivery of the article M between itself and a position below the track R. The transfer apparatus 18 performs reception and delivery of the article M between itself and a shelf or a carry-in/carry-out portion of a storage apparatus or a carry-in/carry-out portion or the like of a processing apparatus or the like, for example. The transfer apparatus 18 can rotate about a rotation axis AX1 in a vertical direction (refer to FIG. 5). The transfer apparatus 18 includes an article holder 13 holding the article M, a hoisting-and-lowering driver 14 hoisting and lowering the article holder 13 in the vertical direction, a lateral mover 11 moving the hoisting-and-lowering driver 14, and a rotator 12 holding the lateral mover 11. The article holder 13 grasps a flange Ma of the article M to hang and hold the article M. The article holder 13 is a chuck including a horizontally movable hook 13a, for example, causing the hook 13a to enter below the flange Ma of the article M, and hoists the article holder 13 to hold the article M. The article holder 13 is connected to a hanger 13b, such as a wire or a belt, for example.

The hoisting-and-lowering driver 14 is a hoist, for example, that draws out the hanger 13b to lower the article holder 13, and winds up the hanger 13b to hoist the article holder 13. The hoisting-and-lowering driver 14 is controlled by the controller 50 to lower or hoist the article holder 13 at a certain speed. The hoisting-and-lowering driver 14 is controlled by the controller 50 to hold the article holder 13 at a target height. The lateral mover 11 includes a plurality of movable plates stacked in the Z direction, for example. The movable plates are movable in the Y direction. The hoisting-and-lowering driver 14 is mounted on a lowermost movable plate. As indicated by the two-dotted dashed lines in FIG. 5, the lateral mover 11 moves the movable plates by a drive apparatus (not illustrated) and can thus laterally move the hoisting-and-lowering driver 14 mounted on the lowermost movable plate and the article holder 13.

The rotator 12 is between the lateral mover 11 and the upper portion 17. The rotator 12 includes a rotating portion 12a and a rotational driver 12b. The rotating portion 12a is rotatable in a direction about a Z axis. The rotating portion 12a supports the lateral mover 11. The rotational driver 12b, for which an electric motor or the like is provided, for example, rotates the rotating portion 12a in a direction about the rotation axis AX1. The rotator 12 rotates the rotating portion 12a through driving force from the rotational driver 12b and can thus rotate the lateral mover 11 (the hoisting-and-lowering driver 14 and the article holder 13) in the direction about the rotation axis AX1.

As illustrated in FIG. 4 and FIG. 5, the traveling vehicle 1 may include a cover W surrounding the transfer apparatus 18 and the article M held by the transfer apparatus 18. The cover W has, for example, a tubular shape with an open lower end including a notched portion through which the movable plates of the lateral mover 11 protrude. The cover W, the upper end of which is mounted on the rotating member 12a of the rotator 12, rotates about an axis of the rotation axis AX1 along with the rotation of the rotating member 12a.

A traveler 20 includes the drive wheel 21, the first auxiliary wheel W1, and the second auxiliary wheel W2 (refer to FIG. 5). The travelers 20 are located at the four respective corner portions of the upper surface 17a of the upper portion 17 (the main body 10) (refer to FIG. 3). In the present preferred embodiment, the four travelers 20 preferably have the same or substantially the same configuration.

That is, the traveling vehicle 1 includes a total of four travelers 20 (drive wheels 21, first auxiliary wheels W1, and second auxiliary wheels W2), with two each on the front side and the rear side in the traveling direction. The drive wheel 21 of each traveler 20 is rotationally driven by the driving force of a traveling driver 33 described below. Without being limited to the configuration in which all of the four drive wheels 21 are driven by the driving force of the traveling driver 33, one or more of the four drive wheels 21 may be rotationally driven. That is, one or more of the four drive wheels 21 may be a driven wheel. Each traveler 20 is turnable in the $\theta Z$ direction about a turning axis AX2 (refer to FIG. 5). Each traveler 20 turns in the $\theta Z$ direction by a steerer 34 described below, and consequently, the traveling vehicle 1 can change the traveling direction.

Figure 6A:
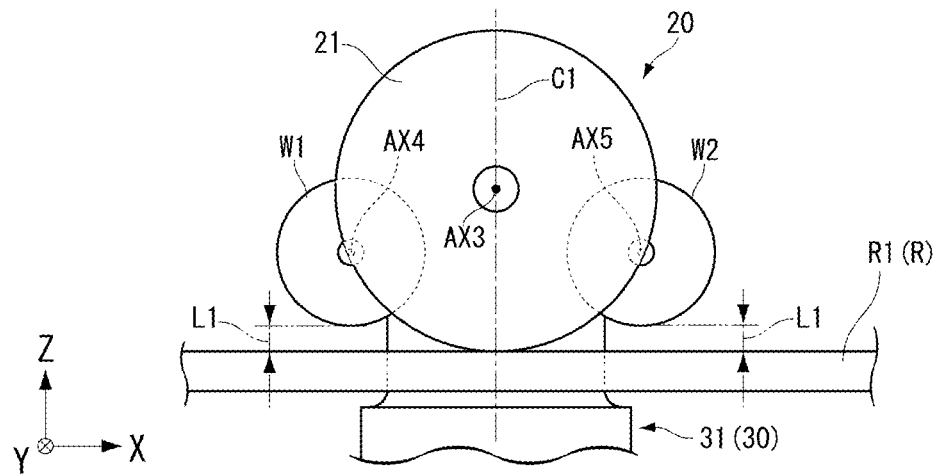
FIGS. 6A to 6C are diagrams illustrating an example of a traveler.
Figure 6B:
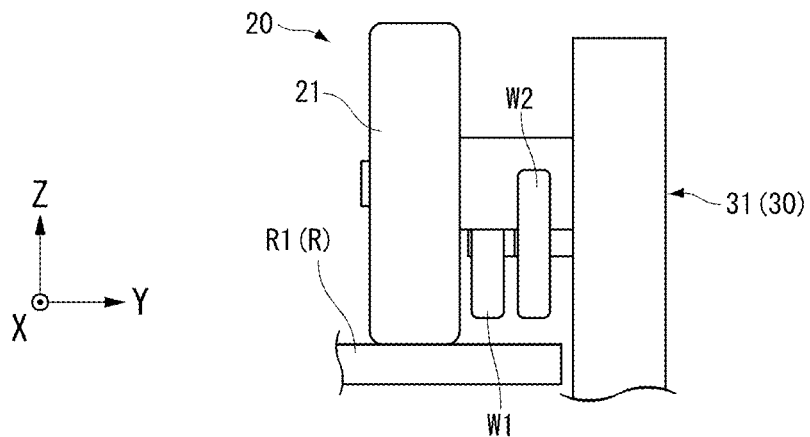
Figure 6C:
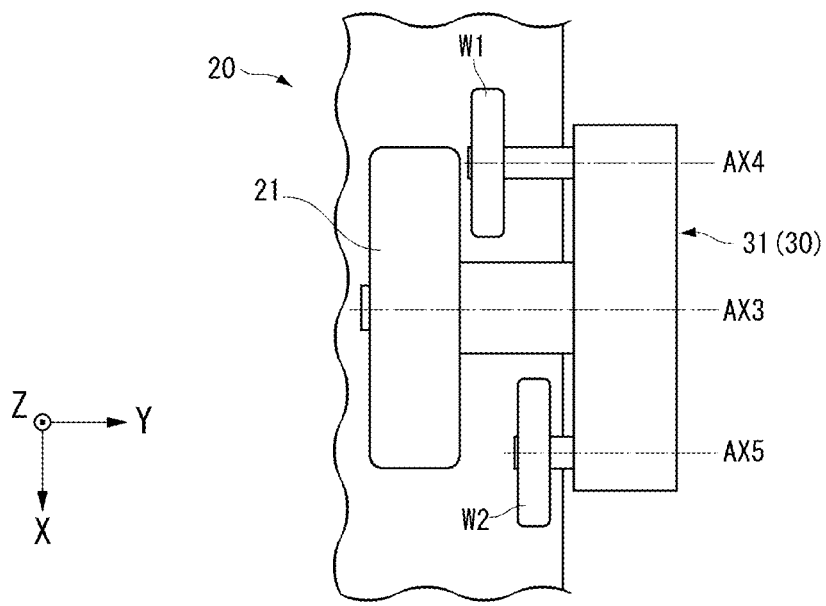

FIGS. 6A to 6C are diagrams illustrating an example of the traveler 20. FIG. 6A is a side view viewed from the −Y direction. FIG. 6B is an elevational view viewed from the +X direction. FIG. 6C is a top view viewed from the +Z direction.

The drive wheel 21, the first auxiliary wheel W1, and the second auxiliary wheel W2 are mounted on rotation axes AX3, AX4, and AX5, respectively, connected to a support 31 of the coupler 30 described below (refer to FIG. 6C). The rotation axes AX3, AX4, and AX5 are each provided in a direction parallel or substantially parallel to the XY plane and orthogonal or substantially orthogonal to the traveling direction of the traveling vehicle 1.

The drive wheel 21 rolls on the traveling surfaces R1$a$, R2$a$, and R3$a$ of the first track R1, the second track R2, and the partial track R3, respectively, in the track R to cause the traveling vehicle 1 to travel. The dimensions of the diameter and the thickness in the direction orthogonal or substantially orthogonal to the traveling direction of the drive wheel 21 are not limited and can be appropriately set. The drive wheel 21 may include skid-proofing, such as providing rubber or the like on circumferential surface to be in contact with the track R. The drive wheel 21 illustrated in FIGS. 6A to 6C is an example and may have another configuration. Two or more drive wheels 21 may be provided in one traveler 20, for example.

A lower end of the drive wheel 21 on the front side and a lower end of the drive wheel 21 on the rear side are provided such that the lower end of the drive wheel 21 on the front side and the lower end of the drive wheel 21 on the rear side do not simultaneously pass through the gap D. In the present preferred embodiment, a spacing L3 between the lower end of the drive wheel 21 on the front side in the traveling direction and the lower end of the drive wheel 21 on the rear side in the traveling direction is set except for a length L4 of the partial track R3 in the traveling direction to a length L5 between an end of the first gap D1 on the near side to an end of the second gap D2 on the far side in the traveling direction (refer to FIG. 3). With this configuration, even when the lower end of one drive wheel 21 of the front side and the rear side is passing through the first gap D1 or the second gap D2, the other drive wheel 21 is in contact with any of the traveling surfaces R1$a$, R2$a$, and R3$a$ of the track R, and thus the traveling driving force of the traveling vehicle 1 can be prevented from being interrupted.

The first auxiliary wheel W1 is on the rear side in the traveling direction of the drive wheel 21. The second auxiliary wheel W2 is on the front side in the traveling direction of the drive wheel 21 (refer to FIG. 6A). The first auxiliary wheel W1 and the second auxiliary wheel W2 are located such that each portion thereof overlaps with the drive wheel 21 when viewed in the direction orthogonal or substantially orthogonal to the traveling direction (from the Y direction in FIGS. 6A to 6C). With this configuration, the traveler 20 can be reduced in size. The first auxiliary wheel W1 and the second auxiliary wheel W2 are positioned symmetrically or substantially symmetrically about a center line Cl in the vertical direction in the drive wheel 21.

The diameters of the first auxiliary wheel W1 and the second auxiliary wheel W2 are smaller than the diameter of the drive wheel 21. With this configuration, the total length of the traveler 20 can be shortened, and in addition, a rotational radius when the traveler 20 is turned in the $\theta Z$ direction can be reduced. In the first auxiliary wheel W1 and the second auxiliary wheel W2, the dimension of the thickness in the direction orthogonal or substantially orthogonal to the traveling direction is smaller than the dimension of the thickness of the drive wheel 21. With this configuration, the track R and the traveler 20 can be compact. In the present preferred embodiment, the dimensions of the diameters and the thicknesses of the first auxiliary wheel W1 and the second auxiliary wheel W2 are preferably each the same or substantially the same. With this configuration, components of the first auxiliary wheel W1 and the second auxiliary wheel W2 can be commonly made, and thus apparatus costs can be reduced.

The diameters and the widths of the first auxiliary wheel W1 and the second auxiliary wheel W2 may be different from each other. The first auxiliary wheel W1 and the second auxiliary wheel W2 may be subjected to a treatment to reduce friction on their circumferential surfaces to be in contact with the track R. With this configuration, a friction coefficient with respect to the track R is reduced, and thus a reduction in a traveling speed of the traveling vehicle 1 can be reduced. The first auxiliary wheel W1 and the second auxiliary wheel W2 illustrated in FIGS. 6A to 6C are examples and may have another configuration. One or both of the first auxiliary wheel W1 and the second auxiliary wheel W2 may include two or more wheels or include a wheel with a tapered shape with respect to the rotation axis direction, for example.

In the present preferred embodiment, a spacing L7 between the rotation axis AX3 of the drive wheel 21 and the rotation axis AX4 of the first auxiliary wheel W1 in the traveling direction is set to a length L8 of the first gap D1 in the traveling direction or more (refer to FIG. 1). With this configuration, the first auxiliary track P1 is used, and the drive wheel 21 can be prevented from falling into the first gap D1. A spacing L9 between the rotation axis AX3 of the drive wheel 21 and the rotation axis AX5 of the second auxiliary wheel W2 in the traveling direction is set to a length L10 of the second gap D2 in the traveling direction or more (refer to FIG. 1). With this configuration, the second auxiliary track P2 is used, and the drive wheel 21 can be prevented from falling into the second gap D2.

The relative positions of the first auxiliary wheel W1 and the second auxiliary wheel W2 in an up-and-down direction (the Z direction) with respect to the drive wheel 21 are each fixed. The first auxiliary wheel W1 and the second auxiliary wheel W2 are each located at a position in non-contact with the traveling surfaces R1$a$, R2$a$, and R3$a$ of the first track R1, the second track R2, and the partial track R3, respectively. Lower ends of the first auxiliary wheel W1 and the second auxiliary wheel W2 are each located at a position higher than the lower end of the drive wheel 21. The first auxiliary wheel W1 is provided such that the lower end of the first auxiliary wheel W1 in the vertical direction is a height in contact with the traveling surface R4$a$ of the first auxiliary track P1. The second auxiliary wheel W2 is provided such that the lower end of the second auxiliary wheel W2 in the vertical direction is a height in contact with the traveling surface R5a of the second auxiliary track P2 (refer to FIG. 1).

The first auxiliary wheel W1 and the second auxiliary wheel W2 are disposed such that the lower end of the first auxiliary wheel W1 and the lower end of the second auxiliary wheel W2 are each higher than the lower end of the drive wheel 21 by a first height L1 (refer to FIG. 6A). During traveling by the drive wheel 21, when the first auxiliary wheel W1 and the second auxiliary wheel W2 come into contact with the traveling surfaces R4a and R5a, there is a risk that the wheel pressure of the drive wheel 21 may not transmit to the traveling surface Ria. With this configuration, during traveling by the drive wheel 21, when the drive wheel 21 does not pass through the first gap D1 or the second gap D2, the drive wheel 21 is in contact with the traveling surface Ria, and both of the first auxiliary wheel W1 and the second auxiliary wheel W2 are not in contact with the traveling surfaces R4a and R5a, and thus the wheel pressure of the drive wheel 21 can be prevented from not transmitting to the traveling surface Ria. The first height L1 is set to be a few hundred micrometers to a few millimeters, for example. The height of the lower end of the first auxiliary wheel W1 and the height of the lower end of the second auxiliary wheel W2 may be different from each other.

In the present preferred embodiment, the first height L1 and the second height L2 are the same or substantially the same. With this configuration, when the lower end of the drive wheel 21 passes through the first gap D1 or the second gap D2, the lower end of the drive wheel 21 can be prevented from moving up and down from the height of the traveling surfaces Ria, R2a, and R3a to maintain the height of the drive wheel 21, such that the traveling vehicle 1 can be prevented from shaking up and down to vibrate during traveling.

The first auxiliary wheel W1 and the second auxiliary wheel W2 are each deviated in their rotation axes AX4 and AX5 direction (the direction orthogonal or substantially orthogonal to the traveling direction) with respect to the drive wheel 21, and the first auxiliary wheel W1 and the second auxiliary wheel W2 are deviated from each other in their rotation axes AX4 and AX5 direction (refer to FIG. 6B). The first auxiliary track P1 and the second auxiliary track P2, in accordance with the first auxiliary wheel W1 and the second auxiliary wheel W2, respectively, are deviated in a rotation axis AX3 direction of the drive wheel (the direction orthogonal or substantially orthogonal to the traveling direction) with respect to the traveling surfaces Ria and R2a of the drive wheel 21, and the first auxiliary track P1 and the second auxiliary track P2 are deviated from each other in the rotation axes AX4 and AX5 direction of the first auxiliary wheel W1 and the second auxiliary wheel W2. In the present preferred embodiment, the first auxiliary wheel W1 and the second auxiliary wheel W2 are each deviated in an outside direction of the track R with respect to the drive wheel 21 (refer to FIG. 6B). With this configuration, the drive wheel 21 is located in an inside direction of the track R, and thus the drive wheel 21 can be prevented from falling into the direction orthogonal or substantially orthogonal to the traveling direction out of the track R. The first auxiliary wheel W1 and the second auxiliary wheel W2 may each be deviated in the inside direction of the track R with respect to the drive wheel 21, or the drive wheel 21 may be located at a position between the first auxiliary wheel W1 and the second auxiliary wheel W2 in the direction orthogonal or substantially orthogonal to the traveling direction.

Thus, in the configuration in which the first auxiliary wheel W1 and the second auxiliary wheel W2 are deviated from each other in their rotation axes AX4 and AX5 direction, and the first auxiliary track P1 and the second auxiliary track P2, in accordance with the first auxiliary wheel W1 and the second auxiliary wheel W2, respectively, are deviated in their rotation axes AX4 and AX5 direction, the first auxiliary wheel W1 is prevented from coming into contact with the second auxiliary track P2, the first auxiliary wheel W1 is prevented from coming into contact with the second auxiliary track P2, and thus resistance and vibration during traveling can be prevented.

In the configuration in which the first auxiliary wheel W1 and the second auxiliary wheel W2 are deviated in their rotation axes AX4 and AX5 direction with respect to the drive wheel 21 and provided such that their lower ends have the first height L1 higher than the lower end of the drive wheel 21, and the first auxiliary track P1 and the second auxiliary track P2 include the upper surfaces at the positions deviated from the traveling surfaces Ria and R2a of the drive wheel 21 and having the second height L1 higher than the traveling surfaces Ria and R2a, the first auxiliary track P1 and the second auxiliary track P2 can be easily located while preventing the drive wheel 21 from overriding the first auxiliary track P1 and the second auxiliary track P2.

The first auxiliary track P1 and the second auxiliary track P2 are configured to correspond to the configurations of the first auxiliary wheel W1 and the second auxiliary wheel W2, respectively. The first auxiliary track P1 is on the near side of the first gap D1 in the traveling direction. The first auxiliary track P1 is provided such that the lower end of the first auxiliary wheel W1 is in contact therewith while the lower end of the drive wheel 21 passes through the first gap D1 when the drive wheel 21 enters the partial track R3 (refer to FIG. 1). The first auxiliary track P1 has a length L12 in the traveling direction at least the same as the length L8 of the first gap D1 in the traveling direction. As the length of the first auxiliary track P1 is shorter, contact between the first auxiliary track P1 and the first auxiliary wheel W1 is further reduced, and thus the generation of particles caused by the contact can be reduced. The length L12 may be about a few tens of millimeters longer than the length L8, for example.

In the present preferred embodiment, the first auxiliary track P1 is absent at a position with which the first auxiliary wheel W1 is in contact while the second auxiliary wheel W2 is in contact with the second auxiliary track P2. With this configuration, unnecessary contact between the first auxiliary track P1 and the first auxiliary wheel W1 can be prevented.

The second auxiliary track P2 is on the far side of the second gap D2 in the traveling direction. The second auxiliary track P2 is provided such that the lower end of the second auxiliary wheel W2 is in contact therewith while the lower end of the drive wheel 21 passes through the second gap D2 when the drive wheel 21 leaves the partial track R3. The second auxiliary track P2 has a length L13 in the traveling direction at least the same as the length L10 of the second gap D2 in the traveling direction. As the length of the second auxiliary track P2 is shorter, contact between the second auxiliary track P2 and the second auxiliary wheel W2 is further reduced, and thus the generation of particles caused by the contact can be reduced. The length L13 may be about a few tens of millimeters longer than the length L10, for example.

In the present preferred embodiment, the second auxiliary track P2 is absent at a position with which second auxiliary wheel W2 is in contact while the first auxiliary wheel W1 is in contact with the first auxiliary track Pb. With this configuration, unnecessary contact between the second auxiliary track P2 and the second auxiliary wheel W2 can be prevented.

In the present preferred embodiment, the first auxiliary track P1 is provided such that contact of the first auxiliary wheel W1 starts when the lower end of the drive wheel 21 reaches the first gap D1, and the second auxiliary track P2 is provided such that contact of the second auxiliary wheel W2 starts when the lower end of the drive wheel 21 reaches the second gap D2. With this configuration, at the same time or substantially the same time as the reaching of the lower end of drive wheel 21 to the first gap D1 or the second gap D2, the first auxiliary wheel W1 or the second auxiliary wheel W2 can support the traveling vehicle 1, and in addition, the first auxiliary track P1 and the second auxiliary track P2 can be short in the traveling direction.

Figure 7A:
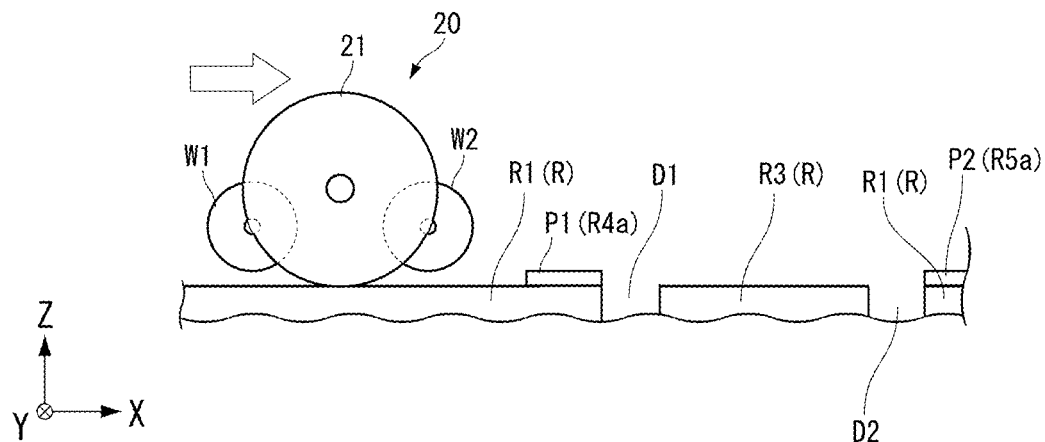
FIGS. 7A to 7C are diagrams illustrating a state in which the traveler travels along the track.
Figure 7B:
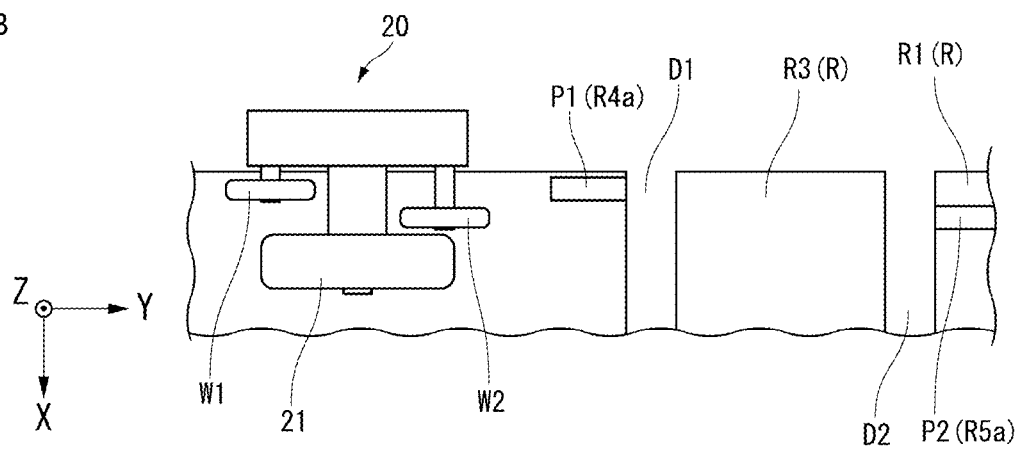
Figure 7C:
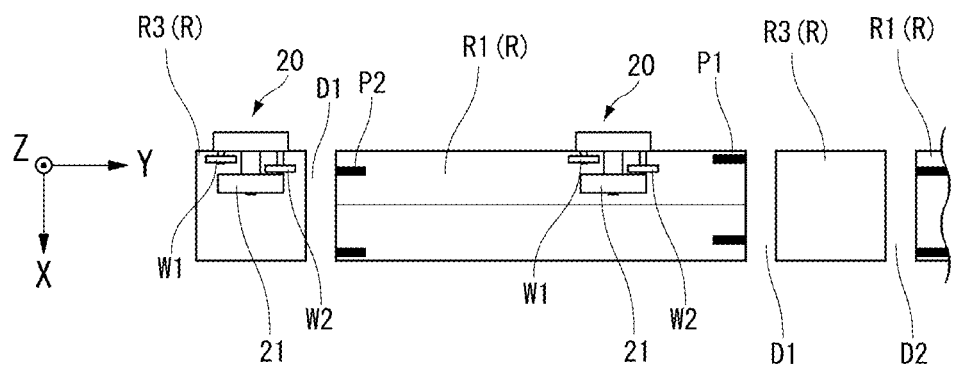

FIGS. 7A to 7C and FIGS. 12A to 12C are diagrams illustrating examples of states in which the traveler 20 travels along the track R. In each diagram of FIGS. 7A to 7C and FIGS. 12A to 12C, FIG. 7A is a side view viewing the traveler 20 on the front side in the traveling direction from the −Y direction, and FIG. 7B is a top view of Fig. A viewed from the +Z direction. FIG. 7C is a top view viewing the travelers 20 on the front side and the rear side in the traveling direction from the +Z direction.

The state illustrated in FIGS. 7A to 7C is a state in which the traveling vehicle 1 travels along the first track R1 toward the first gap D1, and the traveler 20 is positioned on the near side of the first gap D1. At the moment of this state, the lower end of the drive wheel 21 is in contact with the traveling surface R1a. The lower end of the first auxiliary wheel W1 and the lower end of the second auxiliary wheel W2 are not in contact with any of the traveling surface R1a, the first auxiliary track P1, and the second auxiliary track P2. In the traveler 20 on the rear side, the lower end of the drive wheel 21 is in contact with the traveling surface R3a of the partial track R3, and the lower end of the first auxiliary wheel W1 and the lower end of the second auxiliary wheel W2 are not in contact with any of the traveling surface R1a, the first auxiliary track P1, and the second auxiliary track P2. Consequently, the traveling vehicle 1 is supported by the drive wheel 21 on the front side and the drive wheel 21 on the rear side in the traveling direction.

Figure 8A:
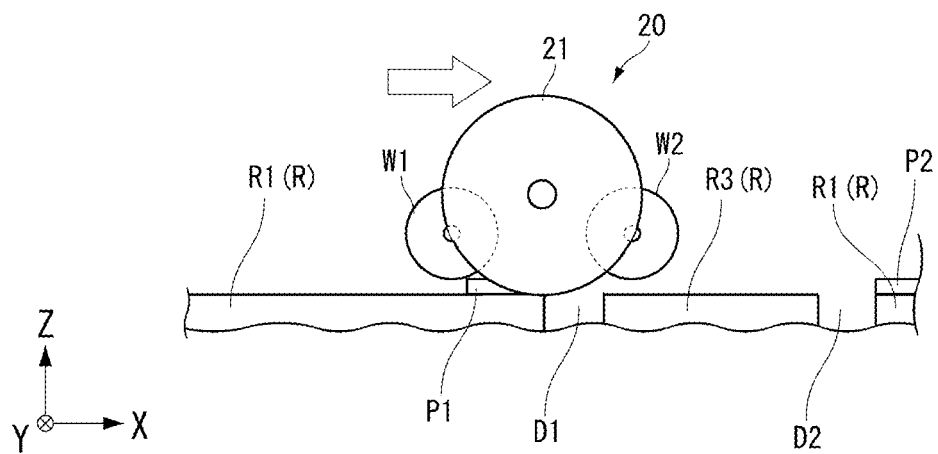
FIGS. 8A to 8C are diagrams illustrating a state in which the traveler travels along the track.
Figure 8B:
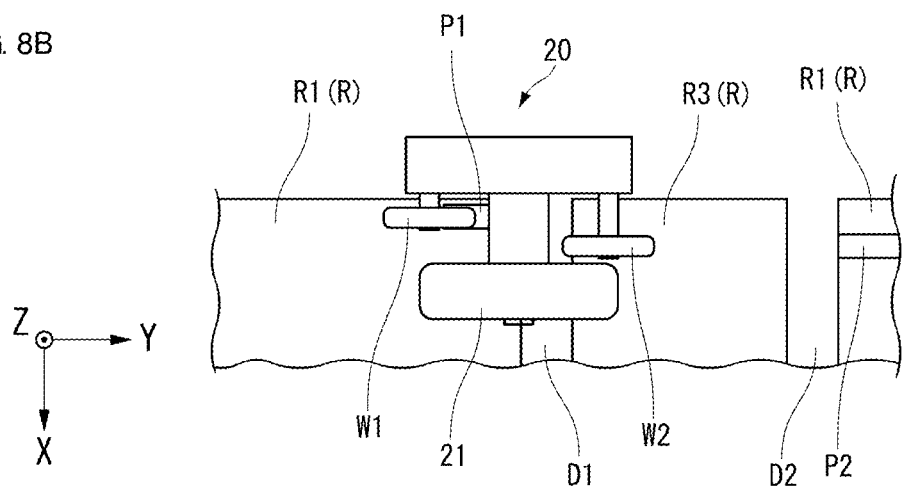
Figure 8C:
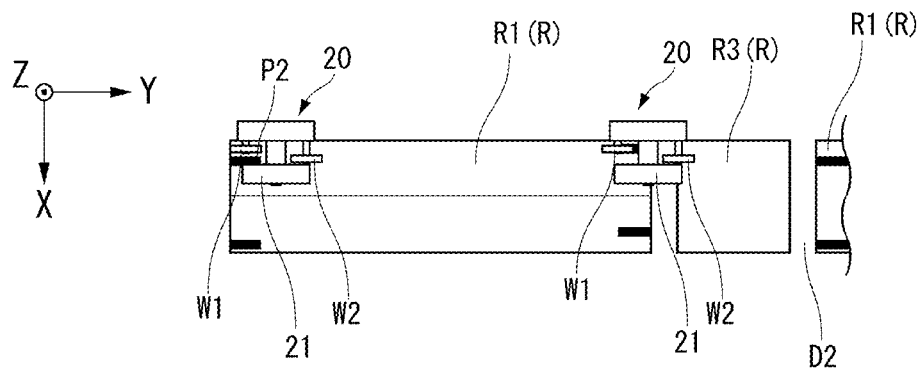

Next, the state illustrated in FIGS. 8A to 8C is a state immediately before the lower end of the drive wheel 21 enters the first gap D1. At the moment of this state, the lower end of the drive wheel 21 is positioned on the near side of the first gap D1 and is in contact with the traveling surface R1a. Consequently, the lower end of the drive wheel 21 does not fall into the first gap D1. When the length L12 of the first auxiliary track P1 is longer than the length L8 of the first gap D1 in the traveling direction, contact of the lower end of the first auxiliary wheel W1 with the first auxiliary track P1 begins at the moment of this state. In the present preferred embodiment, the first auxiliary track P1 is provided such that contact of the first auxiliary wheel W1 starts when the lower end of the drive wheel 21 reaches the first gap D1, and thus in this state, the lower end of the first auxiliary wheel W1 is not in contact with any of the first auxiliary track P1 and the second auxiliary track P2. The lower end of the second auxiliary wheel W2 is not in contact with any of the first auxiliary track P1 and the second auxiliary track P2. In the traveler 20 on the rear side, the lower end of the drive wheel 21 is in contact with the first track R1, and the lower end of the first auxiliary wheel W1 and the lower end of the second auxiliary wheel W2 are not in contact with any of the first track R1, the first auxiliary track P1, and the second auxiliary track P2. Consequently, the traveling vehicle 1 is horizontally supported by the drive wheel 21 on the front side and the drive wheel 21 on the rear side in the traveling direction.

Figure 9A:
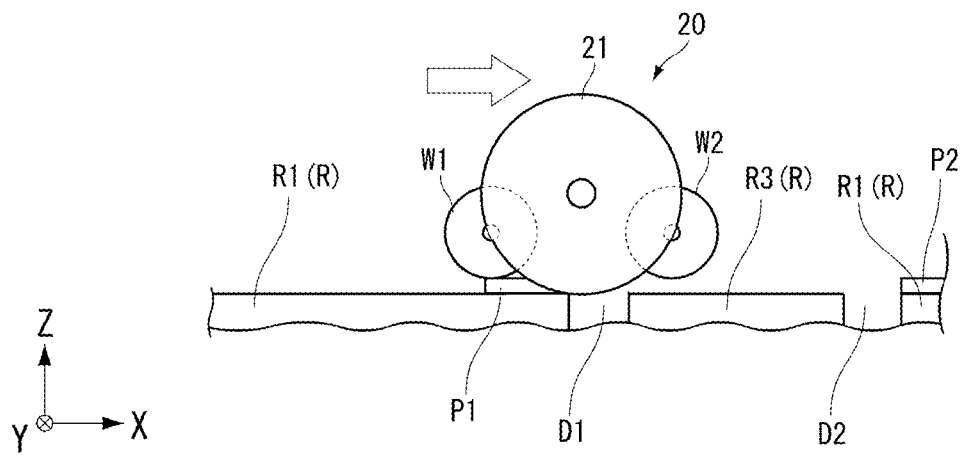
FIGS. 9A to 9C are diagrams illustrating a state in which the traveler travels along the track.
Figure 9B:
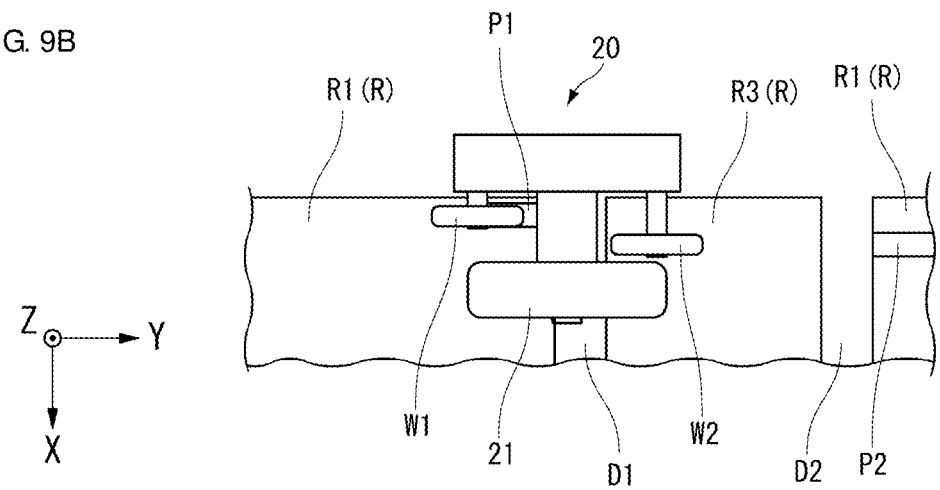
Figure 9C:
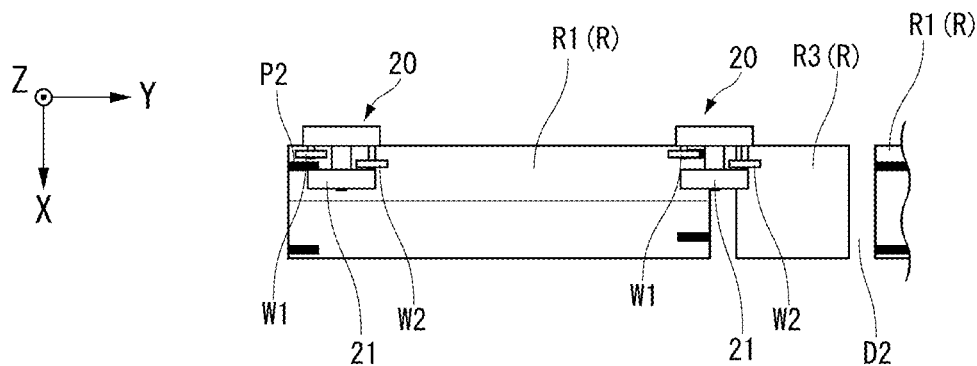

Next, the state illustrated in FIGS. 9A to 9C is a state when the lower end of the drive wheel 21 has entered the first gap D1. At the moment of this state, the lower end of the drive wheel 21 is positioned on the first gap D1, and thus the drive wheel 21 is not in contact with any of the first track R1 and the partial track R3. In the present preferred embodiment, the first auxiliary track P1 is positioned such that contact of the first auxiliary wheel W1 starts when the lower end of the drive wheel 21 reaches the first gap D1, and thus in this state, the lower end of the first auxiliary wheel W1 is in contact with the first auxiliary track P1. Consequently, the lower end of the drive wheel 21 does not fall into the first gap D1. In the present preferred embodiment, the second auxiliary track P2 is not located at the position with which the second auxiliary wheel W2 is in contact while the first auxiliary wheel W1 is in contact with the first auxiliary track P1, and thus the lower end of the second auxiliary wheel W2 is not in contact with any of the traveling surface R1a, the first auxiliary track P1, and the second auxiliary track P2. In the traveler 20 on the rear side, the lower end of the drive wheel 21 is in contact with the first track R1, and the lower end of the first auxiliary wheel W1 and the lower end of the second auxiliary wheel W2 are not in contact with any of the first track R1, the first auxiliary track P1, and the second auxiliary track P2. Consequently, the traveling vehicle 1 is horizontally supported by the first auxiliary wheel W1 on the front side and the drive wheel 21 on the rear side in the traveling direction.

Figure 10A:
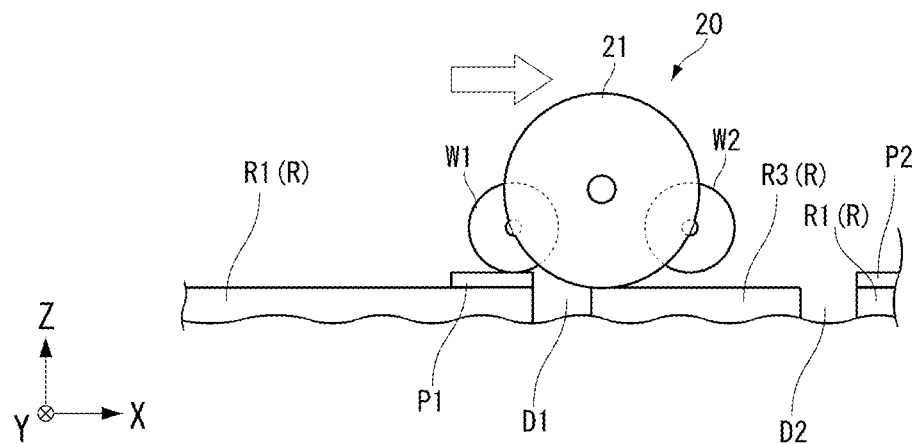
FIGS. 10A to 10C are diagrams illustrating a state in which the traveler travels along the track.
Figure 10B:
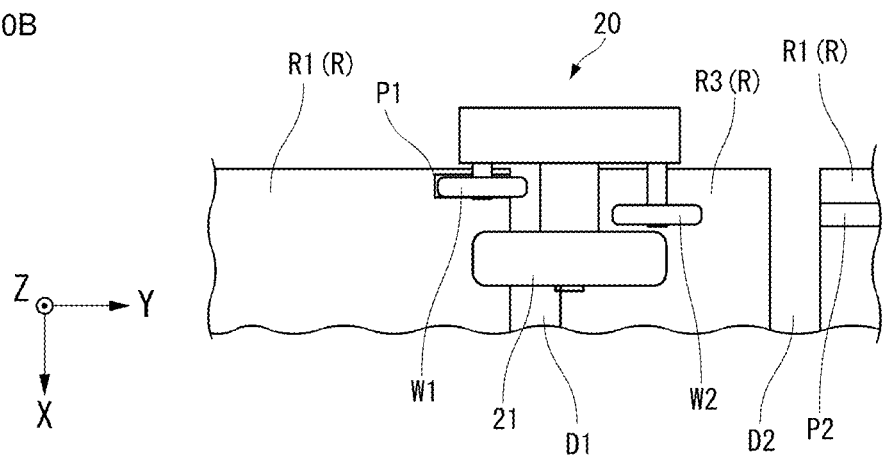
Figure 10C:
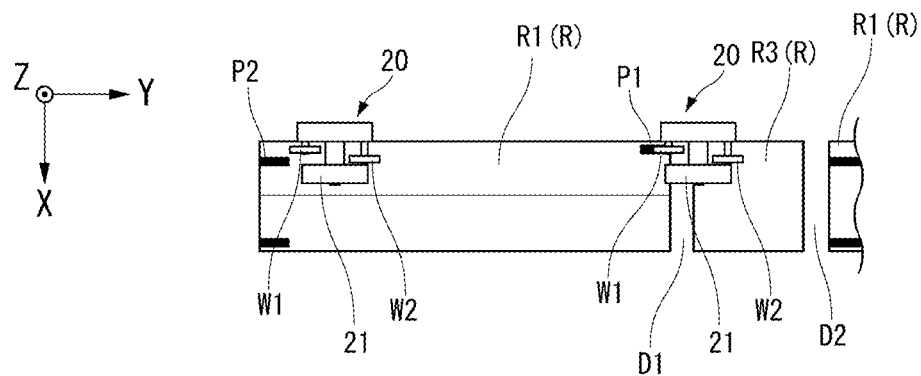

Next, the state illustrated in FIGS. 10A to 10C is a state when the lower end of the drive wheel 21 has entered the partial track R3. At the moment of this state, the lower end of the drive wheel 21 is in contact with the partial track R3, and thus the lower end of the drive wheel 21 does not fall into the first gap D1. At this moment, the first auxiliary wheel W1 is in contact with the first auxiliary track P1. In the present preferred embodiment, the second auxiliary track P2 is not located at the position with which the second auxiliary wheel W2 is in contact while the first auxiliary wheel W1 is in contact with the first auxiliary track P1, and thus the lower end of the second auxiliary wheel W2 is not in contact with any of the first track R1, the first auxiliary track P1, and the second auxiliary track P2. In the traveler 20 on the rear side, the lower end of the drive wheel 21 is in contact with the first track R1, and the lower end of the first auxiliary wheel W1 and the lower end of the second auxiliary wheel W2 are not in contact with any of the first track R1, the first auxiliary track P1, and the second auxiliary track P2. Consequently, the traveling vehicle 1 is horizontally supported by the drive wheel 21 and the first auxiliary wheel W1 on the front side and the drive wheel 21 on the rear side in the traveling direction.

Figure 11A:
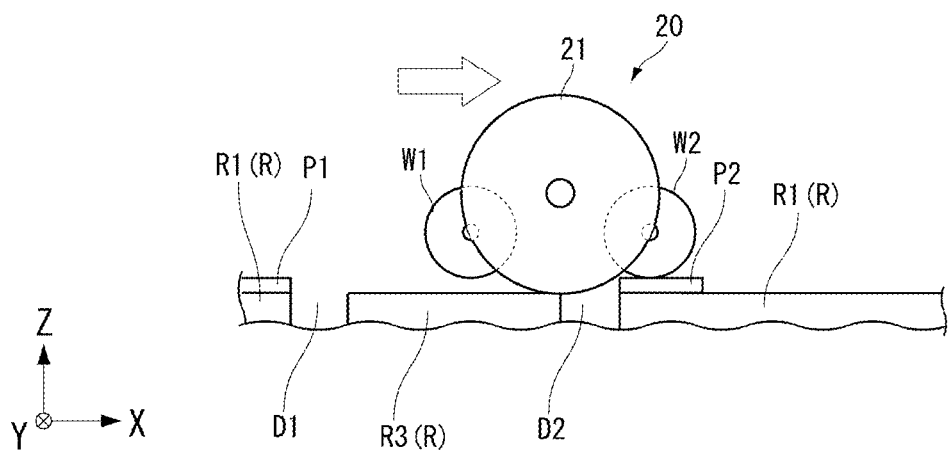
FIGS. 11A to 11C are diagrams illustrating a state in which the traveler travels along the track.
Figure 11B:
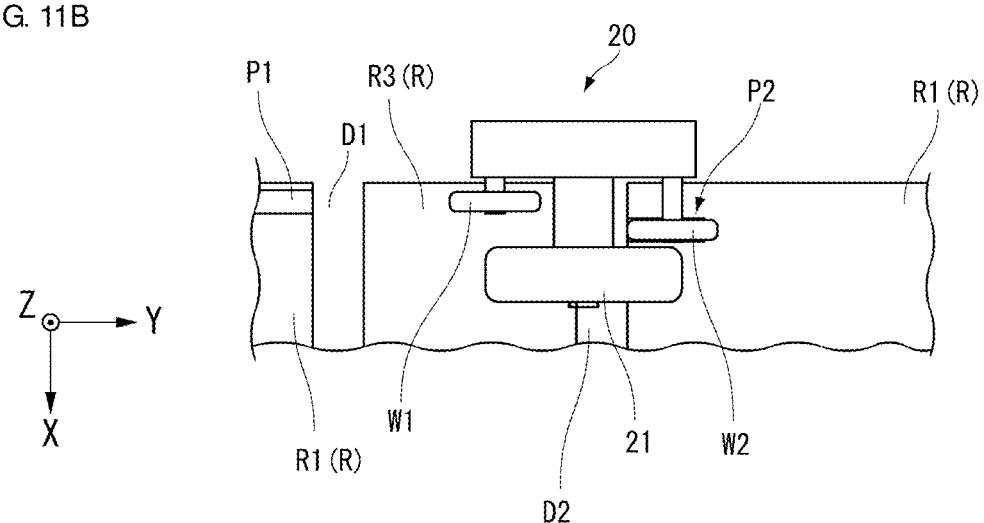
Figure 11C:
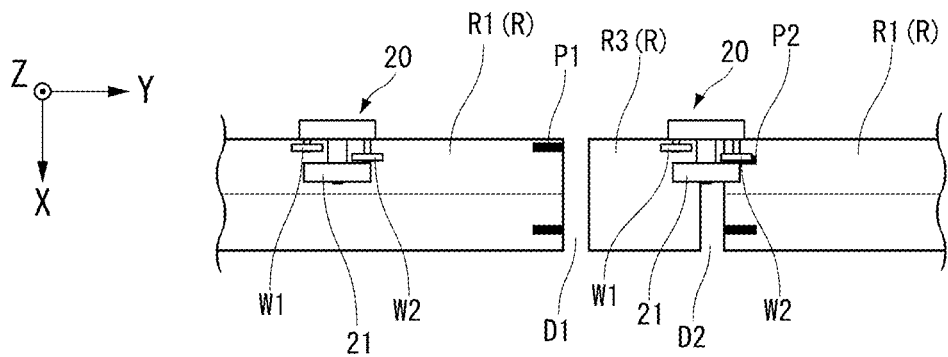

Next, the state illustrated in FIGS. 11A to 11C is a state when the lower end of the drive wheel 21 has entered the second gap D2. At the moment of this state, the lower end of the drive wheel 21 is positioned on the second gap D2, and thus the drive wheel 21 is not in contact with any of the first track R1 and the partial track R3. In the present preferred embodiment, the second auxiliary track P2 is positioned such that contact of the second auxiliary wheel W2 starts when the lower end of the drive wheel 21 reaches the second gap D2, and thus the lower end of the second auxiliary wheel W2 is in contact with the second auxiliary track P2. Consequently, the lower end of the drive wheel 21 does not fall into the second gap D2. The lower end of the first auxiliary wheel W1 is not in contact with any of the first track R1, the first auxiliary track P1, and the second auxiliary track P2. In the traveler 20 on the rear side, the lower end of the drive wheel 21 is in contact with the first track R1, and the lower end of the first auxiliary wheel W1 and the lower end of the second auxiliary wheel W2 are not in contact with any of the first track R1, the first auxiliary track P1, and the second auxiliary track P2. Consequently, the traveling vehicle 1 is horizontally supported by the second auxiliary wheel W2 on the front side and the drive wheel 21 on the rear side in the traveling direction.

Figure 12A:
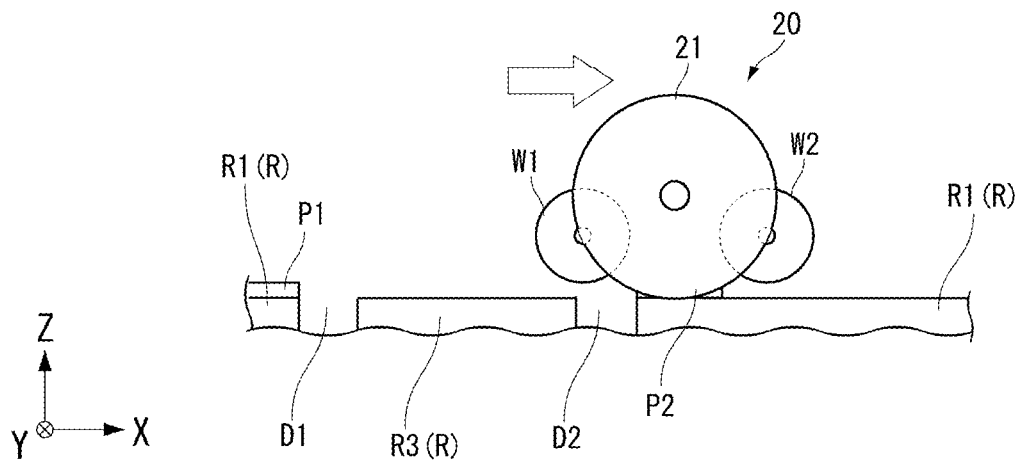
FIGS. 12A to 12C are diagrams illustrating a state in which the traveler travels along the track.
Figure 12B:
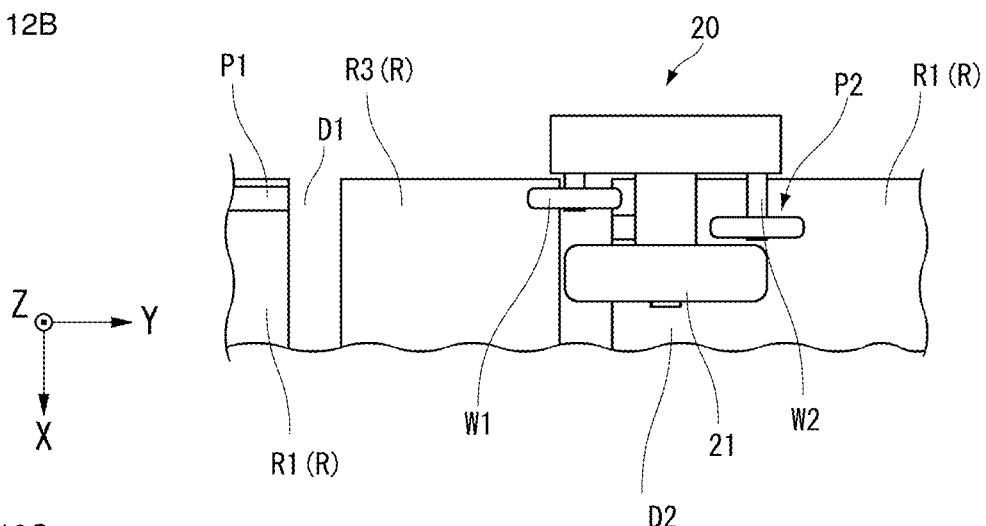
Figure 12C:
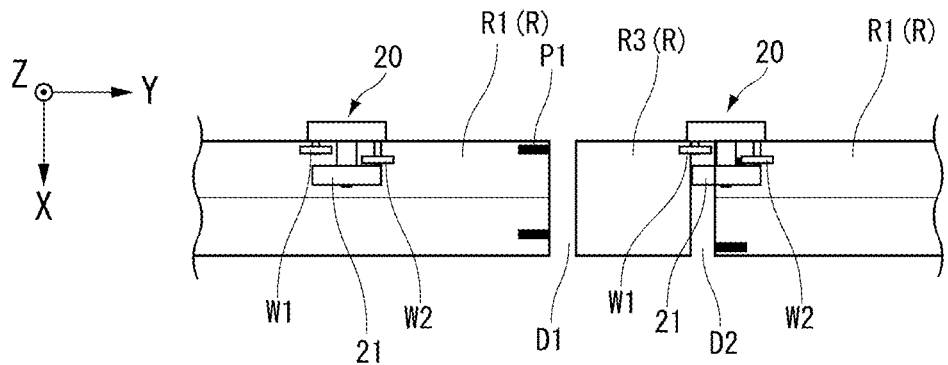

Next, the state illustrated in FIGS. 12A to 12C is a state after the lower end of the drive wheel 21 has left the second gap D2. At the moment of this state, the lower end of the drive wheel 21 is in contact with the first track R1. In the traveler 20 on the rear side, the lower end of the drive wheel 21 is in contact with the first track R1, and the lower end of the first auxiliary wheel W1 and the lower end of the second auxiliary wheel W2 are not in contact with any of the first track R1, the first auxiliary track P1, and the second auxiliary track P2. Consequently, the traveling vehicle 1 is horizontally supported by the drive wheel 21 on the front side and the drive wheel 21 on the rear side in the traveling direction.

As described in the foregoing, in the present preferred embodiment, the drive wheel 21 can be prevented from falling into the gap D provided in a portion of the track R.

Referring back to the descriptions of FIG. 4 and FIG. 5, the couplers 30 couple the upper portion of the main body 10 and the travelers 20 to each other. The couplers 30 vertically hang from the rotation axis of the drive wheel 21 to couple the main body 10 and the travelers 20 to each other. The couplers 30 are provided at the four respective corner portions of the upper surface 17a of the upper portion 17 (of the main body 10). The main body 10 is in a hanging state by these couplers 30 to be disposed below the track R. The coupler 30 includes the support 31 and the connector 32. The support 31 rotatably supports the rotation axis AX3 of the drive wheel 21 and the rotation axes AX4 and AX5 of the first auxiliary wheel W1 and the second auxiliary wheel W2, respectively. The support 31 holds a relative position among the drive wheel 21, the first auxiliary wheel W1, and the second auxiliary wheel W2.

The connector 32 extends downward from the support 31 to be coupled to the upper face 17a of the upper unit 17 and to hold the upper unit 17. The connector 32 includes a transmitter transmitting the driving force of the traveling driver 33 described below to the drive wheel 21 therewithin. For this transmitter, a chain or a belt may be used, or a gear train may be used, for example. The connector 32 is rotatable in the θZ direction about the turning axis AX2. The connector 32 rotates about the turning axis AX2, thus enabling the drive wheel 21 to turn in the θZ direction.

The coupler 30 is provided with the traveling driver 33 and the steerer 34. The traveling driver 33 is mounted on the connector 32. The traveling driver 33 is a driving source driving the drive wheel 21, and an electric motor or the like is used therefor, for example. The four drive wheels 21 are each driven by the traveling driver 33 to be the drive wheels. The four drive wheels 21 are controlled by the controller 50 so as to rotate the same or substantially the same number of times.

The steerer 34 rotates the connector 32 of the coupler 30 about the turning axis AX2 to turn the traveler 20 in the θZ direction. The traveler 20 is turned in the θZ direction, such that the traveling direction of the traveling vehicle 1 can be changed from the first direction (the X direction) to the second direction (the Y direction) or from the second direction to the first direction.

The steerer 34 includes a driver 35, a pinion gear 36, and a rack 37. The driver 35 is mounted on a side surface of the traveling driver 33 separate from the turning axis AX2. For the driver 35, an electric motor or the like may be used, for example. The pinion gear 36 is mounted on a lower surface side of the driver 35 and is rotationally driven in the θZ direction through driving force generated by the driving source 35. The pinion gear 36 is circular or substantially circular in a plan view and includes a plurality of teeth in a circumferential direction on its perimeter. The rack 37 is fixed to the upper surface 17a of the upper portion 17. Racks 37 are provided at the four respective corner portions of the upper surface 17a of the upper portion 17 and are each provided in a fan shape about the turning axis AX2 of the traveler 20. The rack 37 includes a plurality of teeth meshing with the teeth of the pinion gear 36 in a circumferential direction on its perimeter.

The pinion gear 36 and the rack 37 are positioned with the mutual teeth meshing with each other. The pinion gear 36 rotates in the θZ direction, such that the pinion gear 36 moves in a circumferential direction about the turning axis AX2 so as to follow the perimeter of the rack 37. With this movement of the pinion gear 36, the traveling driver 33 and the steerer 34 turn in the circumferential direction about the turning axis AX2 together with the pinion gear 36.

By the turning of the steerer 34, the travelers 20 at the four respective corner portions of the upper surface 17a turn in a range of about 90 degrees in the θZ direction about the turning axis AX2. The drive of the steerer 34 is controlled by the controller 50. The controller 50 may provide an instruction to perform turning operations of the four travelers 20 at the same time or instructions to perform them at different times. The travelers 20 are turned, such that a state in which the drive wheels 21 are in contact with one of the first track R1 and the second track R2 shifts to a state in which the drive wheels 21 are in contact with the other. Thus, the traveling direction of the traveling vehicle 1 can be switched between the first direction (the X direction) and the second direction (the Y direction).

Figure 13A:
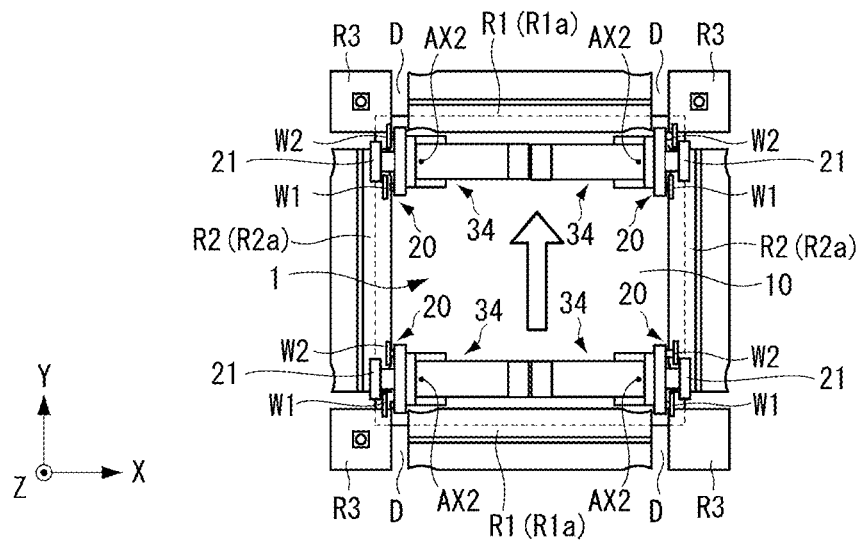
FIGS. 13A to 13C are diagrams illustrating an example of an operation to change a traveling direction.
Figure 13B:
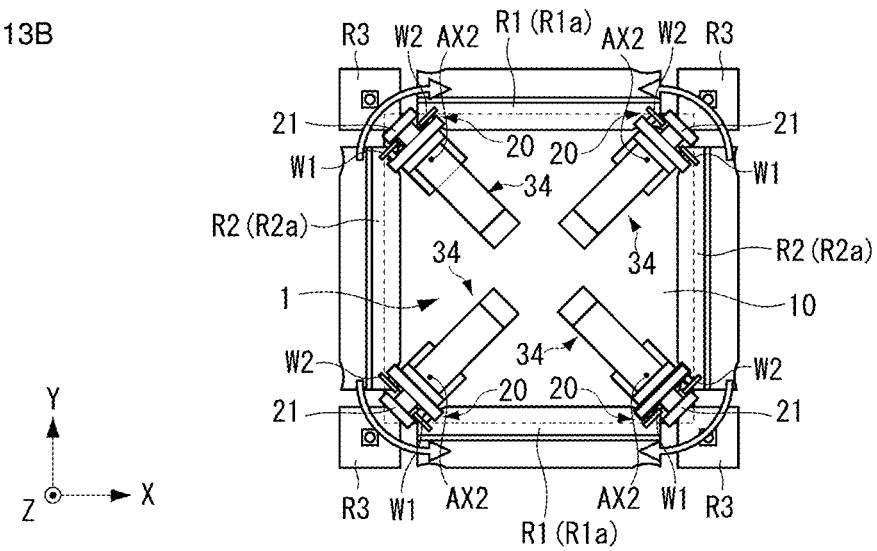
Figure 13C:
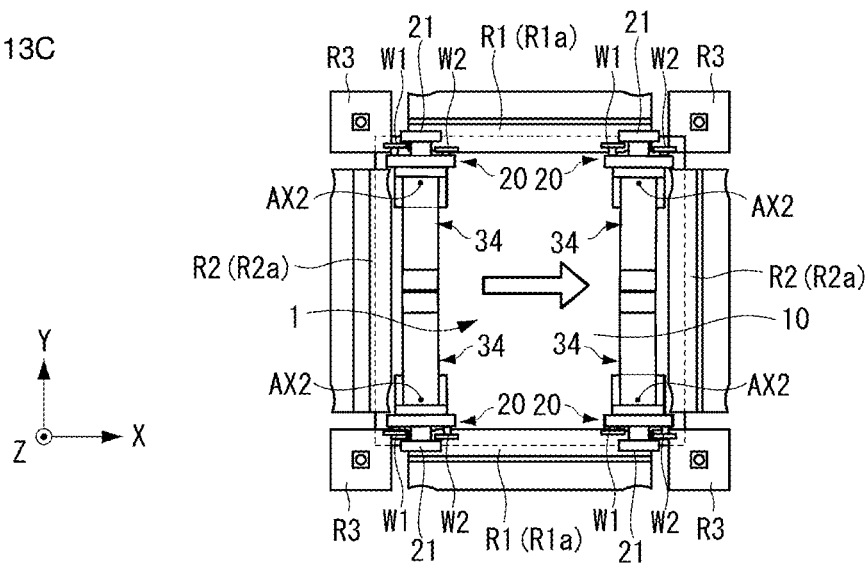

The following describes a case in which the traveling vehicle system SYS changes its traveling direction. FIGS. 13A to 13C are diagrams illustrating an operation to change the traveling direction of the traveling vehicle system SYS from the +Y direction to the +X direction. As illustrated in FIG. 13A, the traveling vehicle system SYS travels in the +Y direction and stops at a position at which the main body 10 has reached the inside of one section (the cell C) of the track R (a position at which the four corner portions have approached respective partial tracks R3). That is, the controller 50 (refer to FIG. 5) stops the drive of the traveling driver 33 at the above position based on position information from a position detector (not illustrated). At this moment, all of the four drive wheels 21 are in contact with the traveling surface R2a of the second track R2.

Next, as illustrated in FIG. 13B, the controller 50 drives steerers 34 to turn the couplers 30 and to turn the travelers 20 at the four respective corner portions in the θZ direction about the turning axis AX2. In this process, the travelers 20 and the like that are diagonally provided turn in the same direction. Among the four travelers 20, the upper left traveler 20 and the like and the lower right traveler 20 and the like in FIG. 13B turn clockwise, for example. On the other hand, the upper right traveler 20 and the like and the lower left traveler 20 and the like in FIG. 13B turn counterclockwise. Such turning operations may be performed at the same time or at different times. The upper left and lower right travelers 20 and the like in FIG. 13B may be turned first simultaneously, and then the upper right and lower left travelers 20 and the like in FIG. 13B may be turned simultaneously, for example.

Next, as illustrated in FIG. 13C, after the travelers 20 and the like have each turned by about 90° in the θZ direction, the controller 50 stops the drive of the steerer 34. The traveling driver 33 is driven in this state, such that the traveling vehicle system SYS is able to travel in the +X direction. The traveling vehicle system SYS can also travel in the −X direction. Even when the travelers 20 and the like turn, the main body 10 does not turn. Consequently, in either case when the traveling vehicle system SYS travels in the Y direction and when the traveling vehicle system SYS travels in the X direction, the orientation of the main body 10 is not changed.

As in the foregoing description, the traveling vehicle system SYS of the present preferred embodiment includes the track R and the traveling vehicle 1 traveling along the track R, the track R including the first gap D1, the partial track R3, and the second gap D2 in order along the traveling direction of the traveling vehicle 1, the traveling vehicle 1 including the drive wheel 21 rolling on the traveling surfaces R1a, R2a, and R3a of the track R, the first auxiliary wheel W1 being in non-contact with the traveling surfaces R1a, R2a, and R3a, on the rear side of the drive wheel 21 in the traveling direction, and having a relative position fixed in the up-and-down direction with respect to the drive wheel 21, and the second auxiliary wheel W2 being in non-contact with the traveling surfaces Ria, R2a, and R3a, on the front side of the drive wheel 21 in the traveling direction, and having a relative position fixed in the up-and-down direction with respect to the drive wheel 21, the spacing L7 between the rotation axis of the drive wheel 21 and the rotation axis of the first auxiliary wheel W1 in the traveling direction being the length L8 of the first gap D1 in the traveling direction or more, and the spacing L9 between the rotation axis of the drive wheel 21 and the rotation axis of the second auxiliary wheel W2 in the traveling direction being the length L10 of the second gap D2 in the traveling direction or more, the traveling vehicle system including the first auxiliary track P1 provided on the near side of the first gap D1 in the traveling direction, having the length in the traveling direction at least the same as the length L8 of the first gap D1 in the traveling direction, and with which the lower end of the first auxiliary wheel W1 is in contact while the lower end of the drive wheel 21 passes through the first gap D1 when the drive wheel 21 enters the partial track R3 and the second auxiliary track P2 provided on the far side of the second gap D2 in the traveling direction, having the length in the traveling direction at least the same as the length of the second gap D2 in the traveling direction, and with which the lower end of the second auxiliary wheel W2 is in contact while the lower end of the drive wheel 21 passes through the second gap D2 when the drive wheel 21 leaves the partial track R3, the second auxiliary track P2 being absent at the position with which the second auxiliary wheel W2 is in contact while the first auxiliary wheel W1 is in contact with the first auxiliary track P1, and the first auxiliary track P1 being absent at the position with which the first auxiliary wheel W1 is in contact while the second auxiliary wheel W2 is in contact with the second auxiliary track P2. The traveling vehicle system SYS has any configuration other than the above, and the configuration other than the above may be present or absent.

According to the above configuration, while the lower end of the drive wheel 21 passes through the first gap D1, the first auxiliary wheel W1 is in contact with the first auxiliary track P1, and the second auxiliary wheel W2 is in non-contact with the traveling surfaces R1a, R2a, and R3a of the track R and the second auxiliary track P2, and while the lower end of the drive wheel 21 passes through the second gap D2, the second auxiliary wheel W2 is in contact with the second auxiliary track P2, and the first auxiliary wheel W1 is in non-contact with the traveling surfaces R1a, R2a, and R3a of the track R and the second auxiliary track P2, and thus placement of an auxiliary track or the like with which the lower end of the first auxiliary wheel W1 or the second auxiliary wheel W2 is in contact can be eliminated in the partial track R3 while preventing the drive wheel 21 from falling into the first gap D1 or the second gap D2 by either of the first auxiliary wheel W1 or the second auxiliary wheel W2. Consequently, even when the traveling surface R3a of the drive wheel 21 in the partial track R3 partially overlaps in a plurality of directions, for example, the auxiliary track or the like is not disposed on the traveling surface R3a, and thus the drive wheel 21 can smoothly travel in the partial track R3.

The technical scope of the present invention is not limited to the features described in the preferred embodiments and modifications thereof described above. One or more of the features and/or elements described with respect to the preferred embodiments and the modifications thereof above may be omitted. The features and/or elements described in the preferred embodiments and the modifications thereof described above can be combined with each other as appropriate.

To the extent permitted by law, the entire disclosure of Japanese Patent Application No. 2018-203022 and all the literature cited in the description of the preferred embodiments and the modifications thereof described above are hereby incorporated herein by reference.

Although the preferred embodiments described above relate to a configuration in which the first auxiliary wheel W1 and the second auxiliary wheel W2 rotate as an example, this configuration is not limiting. The first auxiliary wheel W1 and the second auxiliary wheel W2 do not necessarily rotate, and instead, may slide, for example.

Although the preferred embodiments described above relate to a configuration in which the main body 10 has dimensions to be housed in one section of the grid-shaped track R in a plan view as an example, this configuration is not limiting. The main body 10 may have dimensions larger than one section of the track R in a plan view or have a shape including a portion that protrudes with respect to one section of the track R, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:
1. A traveling vehicle system comprising:
a track; and
a traveling vehicle to travel along the track;
the track including a first gap, a partial track, and a second gap in order along a traveling direction of the traveling vehicle;

the traveling vehicle including a drive wheel to roll on a traveling surface of the track, a first auxiliary wheel not in contact with the traveling surface, on a rear side in the traveling direction of the drive wheel, and fixed in an up-and-down direction with respect to the drive wheel, and a second auxiliary wheel not in contact with the traveling surface, on a front side in the traveling direction of the drive wheel, and fixed in the up-and-down direction with respect to the drive wheel;

a spacing between a rotation axis of the drive wheel and a rotation axis of the first auxiliary wheel in the traveling direction being a length of the first gap in the traveling direction or more, and a spacing between the rotation axis of the drive wheel and a rotation axis of the second auxiliary wheel in the traveling direction being a length of the second gap in the traveling direction or more;

the traveling vehicle system further comprising:

a first auxiliary track provided on a near side of the first gap in the traveling direction, with a length in the traveling direction at least equal or substantially equal to the length of the first gap in the traveling direction, and with which a lower end of the first auxiliary wheel is in contact while a lower end of the drive wheel passes through the first gap when the drive wheel enters the partial track; and a second auxiliary track provided on a far side of the second gap in the traveling direction, with a length in the traveling direction at least equal or substantially equal to the length of the second gap in the traveling direction, and with which a lower end of the second auxiliary wheel is in contact while the lower end of the drive wheel passes through the second gap when the drive wheel leaves the partial track;

the second auxiliary wheel is always out of contact with the second auxiliary track when the first auxiliary wheel is in contact with the first auxiliary track, and the first auxiliary wheel is always out of contact with the first auxiliary track when the second auxiliary wheel is in contact with the second auxiliary track.

2. The traveling vehicle system according to claim 1, wherein the first auxiliary wheel and the second auxiliary wheel are deviated in a rotation axis direction with respect to the drive wheel and lower ends are at a first height higher than the lower end of the drive wheel, and the first auxiliary track and the second auxiliary track include upper surfaces provided at positions deviated from the traveling surface of the track and at a second height higher than the traveling face.

3. The traveling vehicle system according to claim 2, wherein the first height and the second height are the same or substantially the same.

4. The traveling vehicle system according to claim 2, wherein either or both of the first auxiliary track and the second auxiliary track include a protrusion provided on the track.

5. The traveling vehicle system according to claim 1, wherein the first auxiliary wheel and the second auxiliary wheel are deviated from each other in a rotation axis direction; and the first auxiliary track and the second auxiliary track are deviated in the rotation axis direction in accordance with the first auxiliary wheel and the second auxiliary wheel, respectively.

6. The traveling vehicle system according to claim 1, wherein the first auxiliary track is positioned such that contact of the first auxiliary wheel starts when the lower end of the drive wheel reaches the first gap; and the second auxiliary track is positioned such that contact of the second auxiliary wheel starts when the lower end of the drive wheel reaches the second gap.

7. The traveling vehicle system according to claim 1, further comprising:

an additional drive wheel; wherein the drive wheel is a first drive wheel on a front side in the traveling direction; and the additional drive wheel is a second drive wheel on a rear side in the traveling direction; and a spacing in the traveling direction between a lower end of the first drive wheel on the front side and a lower end of the second drive wheel on the rear side in the traveling direction is smaller than a length of the partial track in the traveling direction or greater than a length between an end of the first gap on the near side and an end of the second gap on the far side in the traveling direction.

8. The traveling vehicle system according to claim 1, wherein the traveling vehicle includes a main body mounted on a coupler vertically hanging from the rotation axis of the drive wheel to be positioned below the track; and both the first gap and the second gap enable the coupler to pass therethrough.

9. The traveling vehicle system according to claim 1, wherein the track includes a first track provided along a first direction and a second track provided along a second direction orthogonal to the first direction; and the partial track is positioned at a crossing portion of the first track and the second track.

* * * * *